(12) United States Patent
Chaen

(10) Patent No.: US 10,323,713 B2
(45) Date of Patent: Jun. 18, 2019

(54) ANTIVIBRATION DEVICE

(71) Applicant: HERZ CO., LTD., Kanagawa (JP)

(72) Inventor: Shuichiro Chaen, Kanagawa (JP)

(73) Assignee: Herz Co., Ltd., Yokohama (JP)

( * ) Notice: Subject to any disclaimer, the term of this patent is extended or adjusted under 35 U.S.C. 154(b) by 0 days.

(21) Appl. No.: 15/312,673

(22) PCT Filed: Jul. 23, 2015

(86) PCT No.: PCT/JP2015/070959
§ 371 (c)(1),
(2) Date: Nov. 21, 2016

(87) PCT Pub. No.: WO2016/056291
PCT Pub. Date: Apr. 14, 2016

(65) Prior Publication Data
US 2017/0211655 A1      Jul. 27, 2017

(30) Foreign Application Priority Data

Oct. 8, 2014   (JP) .................................. 2014-207403
May 29, 2015   (JP) .................................. 2015-109452

(51) Int. Cl.
*F16M 11/22*       (2006.01)
*F16F 15/04*       (2006.01)
(Continued)

(52) U.S. Cl.
CPC ............. *F16F 15/04* (2013.01); *F16F 15/08* (2013.01); *F16M 11/22* (2013.01); *G03F 7/709* (2013.01);
(Continued)

(58) Field of Classification Search
USPC .......................................................... 248/57
See application file for complete search history.

(56) References Cited

U.S. PATENT DOCUMENTS 2,580,815 A    1/1952  Mooney et al.
5,030,876 A *  7/1991  EerNisse .............. H03H 9/0514
                                                  310/353
(Continued)

FOREIGN PATENT DOCUMENTS

CN    103573890     2/2014
JP    60-3337       1/1985
(Continued)

OTHER PUBLICATIONS

Supplementary European Search Report dated Feb. 28, 2018 in EP 15 84 9077.
(Continued)

*Primary Examiner* — Monica E Millner
(74) *Attorney, Agent, or Firm* — Fildes & Outland, P.C.

(57) ABSTRACT

An antivibration device which can enhance the antivibration characteristic in the horizontal direction is provided.
An antivibration device 10 includes: a support part 100 supported by at least one first viscoelastic body 400 so as to permit circumferential movement; a carrying part 200 to which a target object 900 for antivibration is mounted; a connecting mechanism 300 connecting the support part 100 with the carrying part 200; wherein the connecting mechanism 300 has at least one second viscoelastic body 350 which permits the circumferential movement of the carrying part 200 with respect to the support part 100. Preferably, the connecting mechanism 300 further includes a suspending plate 302 suspending the carrying part 200; wherein the suspending plate 302 is supported by at least one of the second viscoelastic bodies 350 from the lower side in the gravitational direction.

11 Claims, 31 Drawing Sheets

(51) Int. Cl.
*F16F 15/08* (2006.01)
*G03F 7/20* (2006.01)
*F16F 15/02* (2006.01)
*F16F 1/02* (2006.01)
*F16F 1/12* (2006.01)

(52) U.S. Cl.
CPC .......... *G03F 7/70833* (2013.01); *F16F 1/027* (2013.01); *F16F 1/121* (2013.01); *F16F 15/022* (2013.01); *F16F 15/085* (2013.01)

(56) References Cited

U.S. PATENT DOCUMENTS

| | | | | |
|---|---|---|---|---|
| 5,178,357 | A * | 1/1993 | Platus | F16F 3/026 248/619 |
| 5,213,301 | A | 5/1993 | Taguchi et al. | |
| 5,310,157 | A * | 5/1994 | Platus | F16F 3/026 248/619 |
| 5,370,352 | A * | 12/1994 | Platus | F16F 3/026 248/619 |
| 5,933,215 | A * | 8/1999 | Inoue | G03F 7/70358 355/53 |
| 8,413,948 | B2 * | 4/2013 | Kemeny | A47B 91/005 248/566 |
| 9,593,695 | B2 * | 3/2017 | Hamaguchi | F04D 29/646 |
| 9,733,027 | B2 * | 8/2017 | Platus | F28F 9/26 |
| 2006/0103944 | A1 * | 5/2006 | Ono | G03F 7/70341 359/649 |
| 2008/0218720 | A1 * | 9/2008 | Mayama | G03F 7/70833 355/67 |
| 2008/0258365 | A1 * | 10/2008 | Van De Sande | F16F 15/0232 267/140.14 |
| 2009/0015817 | A1 * | 1/2009 | Morimoto | G03B 27/62 355/75 |
| 2009/0168036 | A1 * | 7/2009 | Hara | G03F 7/70833 355/53 |
| 2009/0180091 | A1 * | 7/2009 | Farnsworth | F16F 9/06 355/67 |
| 2011/0222148 | A1 * | 9/2011 | Oota | G02B 7/028 359/399 |
| 2014/0190677 | A1 | 7/2014 | Platus et al. | |
| 2014/0197330 | A1 * | 7/2014 | Peijster | G03F 7/70833 250/396 R |
| 2014/0234100 | A1 | 8/2014 | Hamaguchi et al. | |

FOREIGN PATENT DOCUMENTS

| | | |
|---|---|---|
| JP | S60-227034 | 11/1985 |
| JP | 63-195445 | 8/1988 |
| JP | 5-215181 | 8/1993 |
| JP | 2002-195343 | 7/2002 |
| JP | 2004-84921 | 3/2004 |
| JP | 2008-20012 | 1/2008 |
| JP | 2009-149339 | 7/2009 |
| JP | 2013-079703 | 5/2013 |
| SU | 1597470 | 10/1990 |
| SU | 1663271 | 7/1991 |
| WO | 2006/038952 | 4/2006 |
| WO | 2008/115589 | 9/2008 |
| WO | 2012/172614 | 12/2012 |

OTHER PUBLICATIONS

English language abstract of JP S60-227034.
English language abstract of CN 103573890.
English language abstract of JP 2013-079703.
Office Action issued in corresponding Japanese Patent Application No. 2014-207403, dated Jun. 28, 2018, and English translation.
English language abstract of JP S63-195445.
English language abstract of JP 2009-149339.
International Search Report in corresponding PCT application No. PCT/JP2015/070959, dated Oct. 6, 2015.
English language abstract of JP 2008-20012.
English language, abstract of JP 2002-195343.
English language machine translation of JP 60-3337.
English language abstract of JP 2004-84921.

* cited by examiner

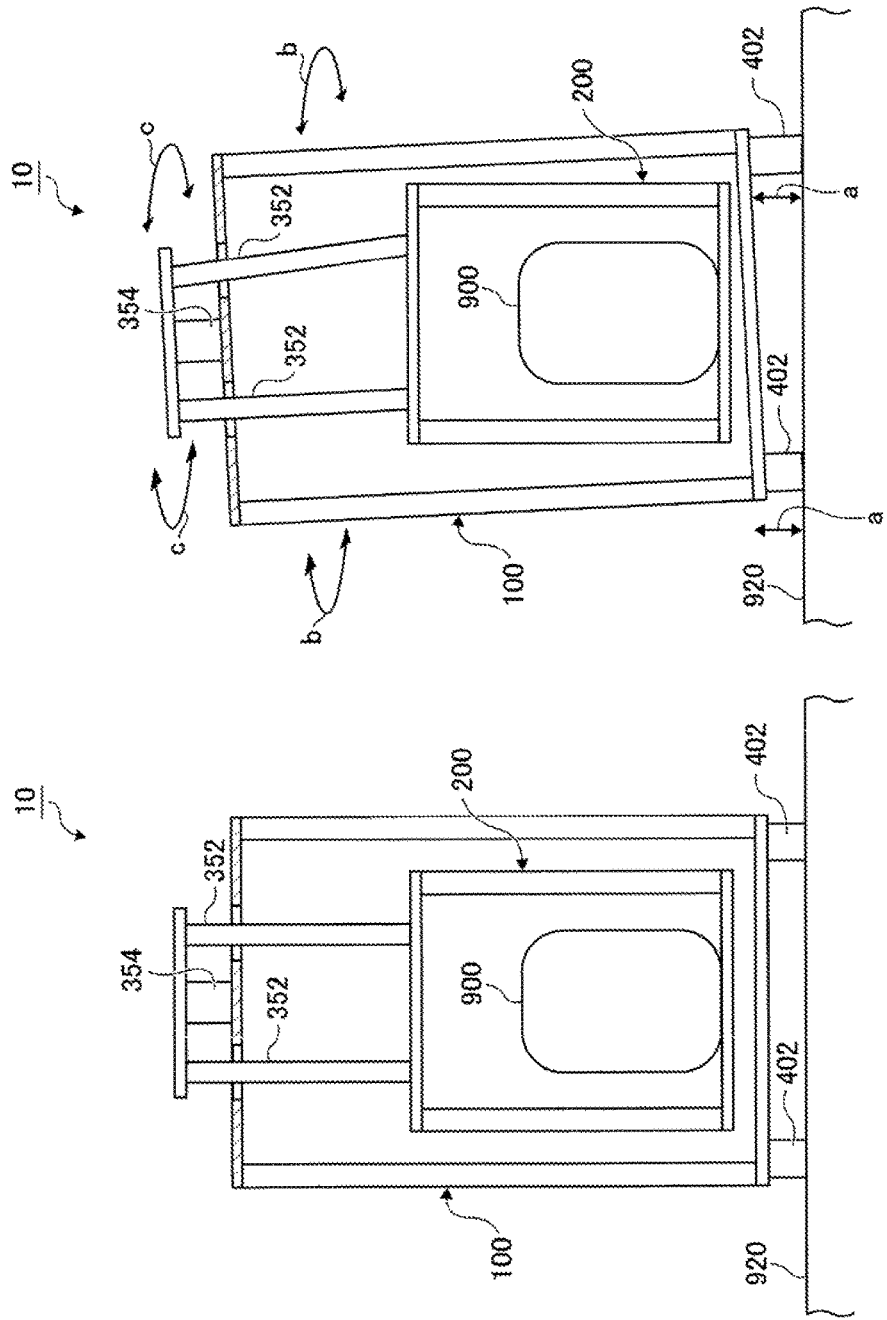

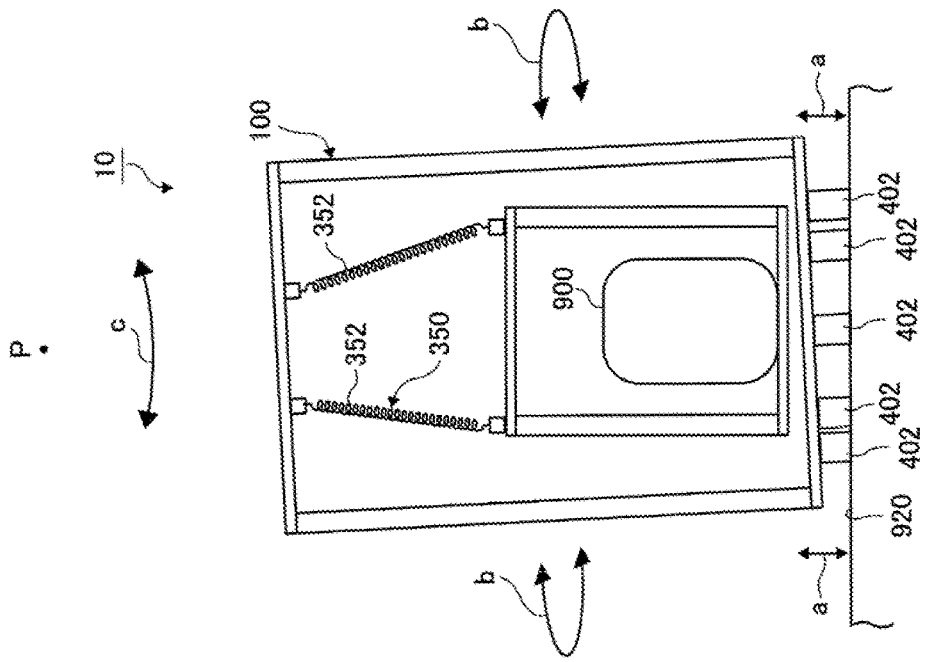
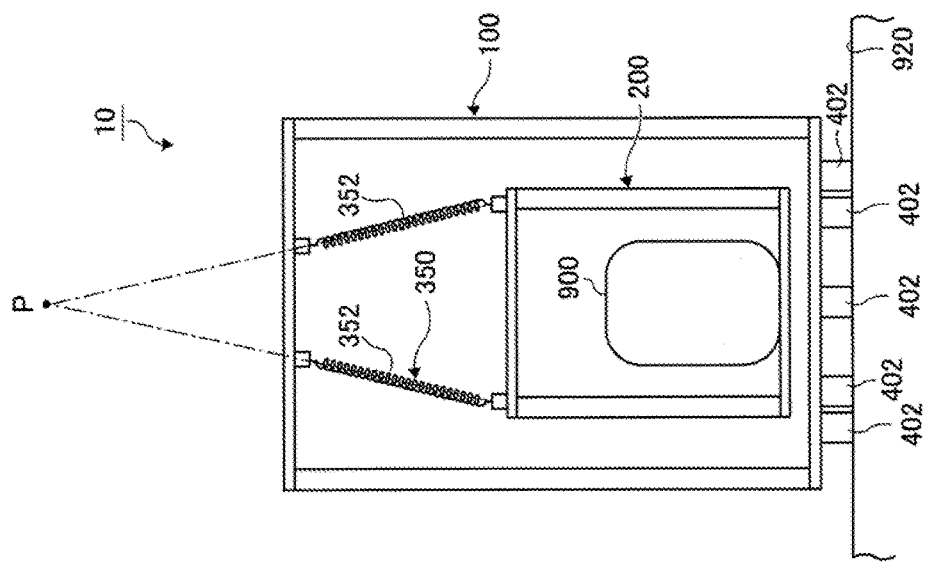

ANTIVIBRATION DEVICE

TECHNICAL FIELD

This invention relates to an antivibration device.

BACKGROUND ART

The patent document 1 describes an antivibration device including: a bottom plate horizontally and fixedly placed; a top plate placed above the bottom plate by a predetermined space and supporting an object such as a structural material to be supported; a middle plate horizontally placed between the bottom plate and the top plate and having a through hole at the center thereof; one first viscoelastic body connecting the bottom plate with the top plate through the through hole of the middle plate; at least three first compression coil springs placed around the viscoelastic body so as to extend m the vertical direction between the bottom plate and the middle plate; and at least three second compression coil springs placed at the same position as the first compression coil springs with respect to the horizontal direction so as to extend in the vertical direction between the middle plate and the top plate; wherein the first and the second compression coil springs which correspond to each other are placed around the central axle of the first viscoelastic body in a point symmetrical manner or in an equivalent angle intervals and a plurality of second viscoelastic bodies extending in the vertical direction so as to connect the bottom plate with the middle plate are placed at positions where the first compression coil springs are not interfered therewith with respect to the horizontal direction between the bottom plate and the middle plate.

The patent document 2 describes an active antivibration table including a bench having a planer shape for placing an equipment thereon; dampers supporting the bench at the four corners of the under surface thereon; a vibration sensor for measuring vibration of the bench; an actuator for moving the bench; and a controller for calculating a control output to the actuator based on vibration information output from the vibration sensor; wherein the active anti-vibration table is provided with a coil spring in the vertical direction used as the dampers and is provided with the actuator and the vibration sensor near the coil spring.

PRIOR ART DOCUMENT

Patent Document

PATENT DOCUMENT 1 JP2008-20012, A
PATENT DOCUMENT 2 JP2002-195343, A

SUMMARY

Problems to be Solved by the Invention

In the prior art, the antivibration characteristic in the horizontal direction is not enough.

Further, in the prior art, the elastic bodies need to be replaced in response to change of the weight of the target object for antivibration, therefore, the natural frequency at the time when the vibration being transferred to the target object for antivibration cannot be efficiently decreased.

The present invention aims to provide an antivibration device which can enhance the antivibration characteristic in the horizontal direction. Further, the present invention aims to provide fit antivibration device in which the same elastic body can be used for target objects for antivibration having weight within a certain scope value and which can decrease the natural frequency at the time when the vibration being transferred to the target object for antivibration.

Means for Solving the Problem

The present invention according to Claim 1 is an antivibration device including: a support part supported by at least one first viscoelastic body so as to permit circumferential direction movement; a carrying part to which a target object for antivibration is mounted; and a connecting mechanism connecting the support part with the carrying part; Wherein the connecting mechanism has at least one second viscoelastic body which permits circumferential direction movement of the carrying part with respect to the support part.

The present invention according to Claim 2 is an antivibration device of Claim 1, wherein the connecting mechanism further has a suspending part suspending the carrying part; and the suspending part is supported by the at least one second viscoelastic body from lower side in the gravitational direction.

The present invention according to Claim 3 is an antivibration device of Claim 1, wherein the connecting mechanism further has a suspending part suspending the carrying part; and the suspending part is suspended by a plurality of the second viscoelastic bodies.

The present invention according to Claim 4 is an antivibration device of Claim 1, wherein the connecting mechanism has a plurality of the second viscoelastic bodies; and each of the plurality of the second viscoelastic body: suspends the carrying part; is connected to the carrying part at one end part side thereof; and is placed so that segment of lines each extending from the one end part side to the other end part side thereof intersect each other at one point.

The present invention according to Claim 5 is an antivibration device of Claim 1, wherein the connecting mechanism has a plurality of the second viscoelastic bodies; and each of the plurality of the second viscoelastic body; suspends the carrying part; is connected to the carrying part at one end part side thereof; and is placed so that the other end part side thereof is supported at one point.

The present invention according to Claim 6 is an antivibration device including: a carrying part to which a target object for antivibration is mounted; a support part supporting the carrying part; and a connecting mechanism connecting the carrying part with the support part; wherein the connecting mechanism has at least two elastic bodies which are attached to the carrying part at one end part side thereof and are attached to the support part at the other end part side thereof; and the each of the at least two elastic body curves so as to have at last two inflexion points.

The present invention according to Claim 7 is an at device of Claim 6 further having a position adjustment mechanism for adjusting the positions where the at least two elastic bodies are attached to the support part.

The present invention according to Claim 8 is an antivibration device of Claim 6 further having an angle adjustment mechanism for adjusting the angle of the at least two elastic bodies being attached to the support part.

The present invention according to Claim 9 is an antivibration device of Claim 6, wherein the at least two elastic bodies support the carrying part so that a portion from the inflexion point which is nearest to the one end part among the at least two inflexion points up to the one end part thereof forces up the carrying part in a direction across the thickness of the elastic bodies.

The present invention according to Claim 10 is an antivibration device of claim 6 further having a position adjustment mechanism for adjusting the positions where the at least two elastic bodies are attached to the carrying part.

The present invention according to Claim 11 is an antivibration device of Claim 6 further having an angle adjustment mechanism for adjusting the angle of the at least two elastic bodies being attached to the carrying part.

The present invention according to Claim 12 is an antivibration device of Claim 6, wherein the at least two elastic bodies support the carrying part so that a portion from the inflexion point which is nearest to the other end part among the at least two inflexion points up to the other end part thereof forces up the carrying part in a direction across the thickness of the elastic bodies.

The present invention according to Claim 13 in an antivibration device of Claim 6, wherein the at least two elastic bodies are placed so that the forces applied by the elastic bodies to the carrying part are balanced with each other in the horizontal plane direction.

The present invention according to Claim 14 is an antivibration device including: a carrying part to which a target object for antivibration is mounted; a support part supporting the carrying part; and a connecting mechanism connecting the carrying part with the support part; wherein the connecting mechanism has: a suspending part suspending the carrying part; at least two first elastic bodies which are attached to the suspending part at one end part side thereof and are attached to the support part at the other end part side thereof; and at least two second elastic bodies which are attached to the suspending part at one end part side thereof and are attached to the carrying part at the other end part side thereof; wherein the at least two first elastic bodies and the at least two second elastic bodies each curves so as to have at least two inflexion points.

The present invention according to Claim 15 is an antivibration device including: a carrying part to which a target object for antivibration is mounted a first support part supporting the carrying part; a second support part supporting the first support part; a first connecting mechanism connecting the carrying part with the first support part; and a second connecting mechanism connecting the first support part with the second support part; wherein the first connecting mechanism has at least two first elastic bodies which are attached to the carrying part at one end part side thereof and are attached to the first support part at the other end part side thereof; the second connecting mechanism has at least two elastic bodies which arc supported by the first support part at one end part side thereof and are supported by the second support part at the other end part side thereof; and the at least two first elastic bodies and the at least two second elastic bodies each curves so as to have at feast two inflexion points.

The present invention according to Claim 16 is an antivibration device of Claim 15 wherein force applied by the at least two first elastic bodies to the carrying part and force applied by the at least two second elastic bodies to the first support part are directed to different directions in the horizontal plane direction.

Advantageous Effect

According to the invention of Claims 1 to 5, the antivibration characteristic in the horizontal direction can be enhanced.

Further, according to the invention according to Claims 6 to 16, an antivibration device in which the same elastic body can be used for target objects for antivibration having weight within a certain scope value and which can decrease the natural frequency at the time when die vibration being transferred to the target object for antivibration can be provided.

BRIEF DESCRIPTION OF THE DRAWINGS

FIG. 2 shows the antivibration device depicted by FIG. 1.

FIG. 3 shows how the antivibration device depicted by FIG. 1 works. FIG. 3A shows the antivibration device in a state that no vibration is applied thereto. FIG. 3B shows the antivibration device in a state that vibration is applied thereto.

FIG. 5 shows the antivibration device depicted by FIG. 4.

FIG. 7 shows the antivibration device depicted by FIG. 6.

FIG. 9 shows the anti vibration device depicted by FIG. 8.

FIG. 11 shows the antivibration device depicted by FIG. 10.

FIG. 13 shows the antivibration device depicted by FIG. 12.

FIG. 14 shows how the antivibration device depicted by FIG. 12 works. FIG. 14A shows the antivibration device in a state that no vibration is applied thereto. FIG. 14B shows the antivibration device in a state that vibration is applied thereto.

FIG. 15 shows the antivibration device according to the seventh embodiment of the present invention.

FIG. 16 shows an antivibration device according to a modified example.

FIG. 21 shows effects of the antivibration device 1010 depicted by FIG. 18.

FIG. 23 shows an effect of the antivibration device depicted by FIG. 18.

FIG. 30 shows a modified example of an elastic body which can be used in the eighth embodiment.

EXEMPLARY EMBODIMENT OF THE INVENTION

Figure 1:
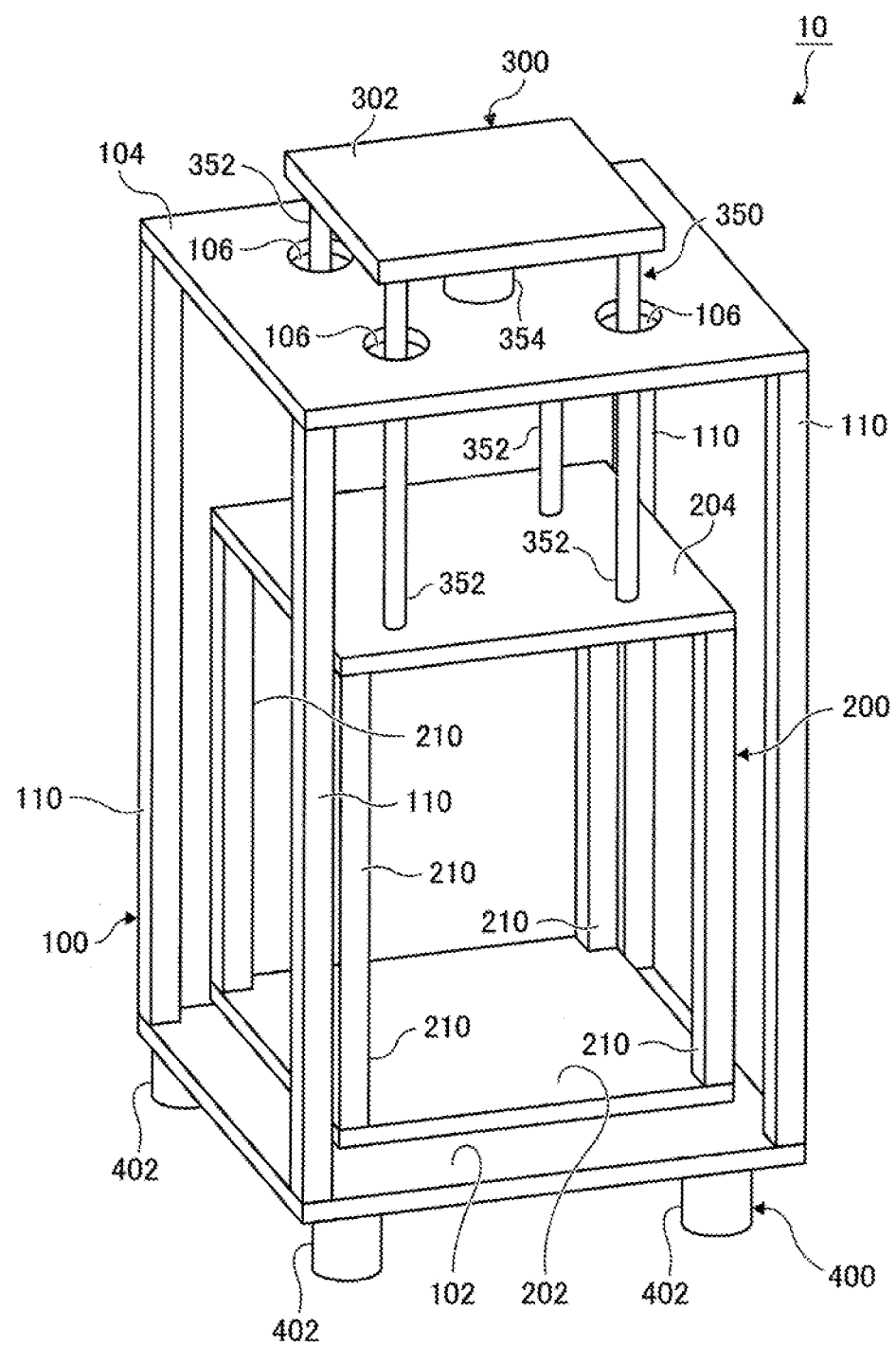
FIG. 1 shows a perspective view depicting an antivibration device according to the first embodiment of the present invention.
Figure 2A:
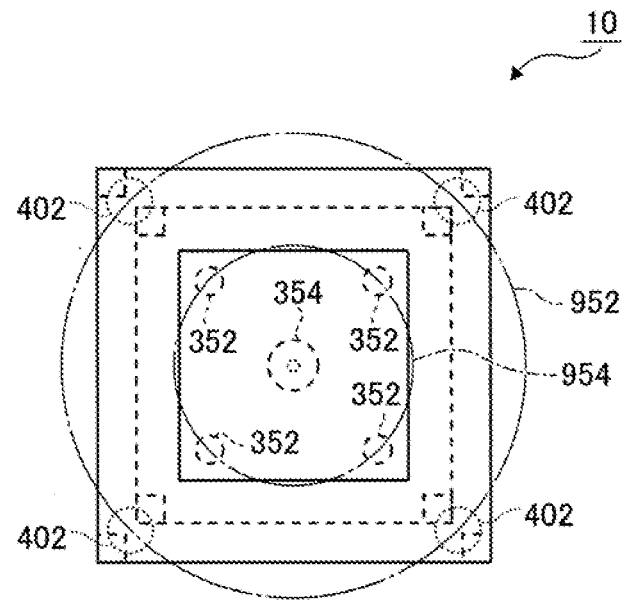
FIG. 2A shows a plan view.

Embodiments of the present invention will be described hereinafter with reference to the drawings. FIGS. 1 and 2 show an antivibration device 10 according to the first embodiment of the present invention. As shown in FIGS. 1 and 2, the antivibration device 10 has a support part 100, a carrying part 200, a connecting mechanism 300, and foot members 402.

The support part 100 is, for example, supported by the four foot members 402 from the lower side of the gravitational direction so as to permit circumferential direction movement thereof. The support part 100 has a bottom plate 102 and a top plate 104 and the bottom plate 102 and the top plate 104 are connected by, for example, the four post members 110 thereby forming a frame body. Further, the top plate 104 is formed with, for example, four through holes 106. The four through holes 106 are formed so as to be placed on a circumference of one circle 952.

The foot members 402 are used as a first viscoelastic body 400 which allows the support part 100 to move in the circumferential direction with respect to an installation surface 920 (refer to FIG. 3) and as for the foot members 402, for example, a cylindrical rubber block and a coil spring can be used. Any viscoelastic body which stretches and contracts at least in the gravitational direction can be used as the foot member 402, and other member also can be used as an alternative to the rubber block and the coil spring. The foot members 402 are attached at their respective upper end parts to bottom end parts of the bottom plate 102. Further, the each bottom end part of the foot members 402 is contact in the installation surface 920 in a state that the antivibration device 10 is mounted on the installation surface 920.

The plurality of foot members 402 such as four foot members are placed on a circumference of one circle 954. Further, the circle 954 is concentric to the circle 952. The foot members 402, if they permit the movement of the support part 100 in the circumferential direction, do not need to have four members in number but can have at least one member.

In the case that the foot member 402 is one member, the foot member 402 needs to be a viscoelastic body which not only stretches and contracts only to and deforms only into up and down direction but also stretches and contracts to and deforms into the parallel direction to the installation surface 920 in order to allow the support part 100 to move into the circumferential direction with respect to the installation surface 920.

Figure 2B:
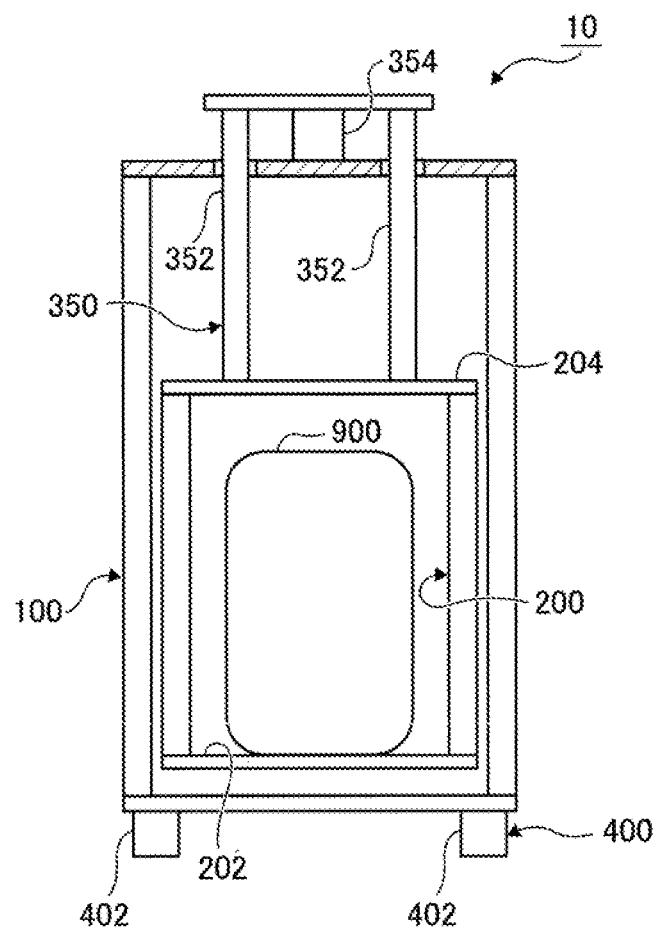
FIG. 2B shows a side devotional view.

A target object 900 for antivibration is placed on the carrying part 200. Apparatuses in which an accuracy in nanometer order come to be an issue can be raised as for the target object 900 for antivibration, which apparatuses are e.g. an exposure machine for forming circuit patterns for electronic devices used in computers and communication equipments, a three-dimensional shape measuring device for measuring fine shape of optical devices used for optical measurement making use of a blue laser, and an electron microscope used for genetic analysis etc. The carrying part 200 has a bottom plate 202 and a top plate 204 and the top plate 204 and the bottom plate 202 are connected by, for example, the four post members 210 thereby forming a frame body. As shown in FIG. 2B, the target object 900 for antivibration is placed on an upwardly directed surface of the bottom plate 202 in the gravitational direction.

The connecting mechanism 300 connects the support part 100 with the carrying part 200. Further, the connecting mechanism 300 has a suspending plate 302 used as a suspending part which supports the carrying part 200 in a hanging manner, (e.g. four) suspending members 352, and (e.g. one) foot member 354.

The suspending members 352 are used as a second viscoelastic body 350 which permits the circumferential direction movement of the carrying part 200 with respect to the support part 100. A viscoelastic body such as a coil spring can be used as the suspending member 352. Each suspending members 352 is placed so as to penetrate thorough the through hole 106, and each top end part thereof is attached to the downwardly directed surface of the suspending plate 302 in the gravitational direction while each bottom end part thereof is attached to the upwardly directed surface of the suspending plate 302 in the gravitational direction.

It is preferable that the four suspending members 352 are the same length with respect to each other. Further, the top end parts of the four suspending members 352 are attached to the suspending plate 302 so as to be placed on a circumference of a circle 954. Further, the bottom end parts of the four suspending members 352 are respectively placed on the circumference of the circle 954. Further, the four suspending members 352 are placed in a horizontal manner with respect to each other in a state that no vibration is applied to the antivibration device 10.

Any viscoelastic body can be used for the suspending members 352, and a string type rubber member, for example, can be used as an alternative, to the coil spring.

The foot member 354 is used as the second viscoelastic body 350 which permits the circumferential direction movement of the carrying part 200 with respect to the support part 100 as the same with the suspending members 352 and supports the suspending plate 302 from the lower side in the gravitational direction. Further, in this embodiment, one foot member 354 is used. As for the foot member 354, for example, a cylindrical rubber block and a coil spring can be used. In the case that one foot member 354 is used, the foot member 354 should be a member which stretches to and deforms into the gravitational direction and the horizontal direction.

The foot member 354 is attached at its upper end part to the downwardly directed surface of the suspending plate 302 in the gravitational direction and is attached at its bottom end part to the upwardly directed surface of the top plate 204 in the gravitational direction. Further, the foot member 354 is attached so as to locate at the center of the circle 952 and the circle 954 which are concentric to each other.

FIG. 3 shows how the antivibration device 10 works. FIG. 3A shows the antivibration device 10 in a state that no vibration is applied thereto. FIG. 3B shows the antivibration device 10 in a state that vibration is applied thereto. For example, when horizontal vibration is applied to the antivibration device 10 in the state shown in FIG. 3A in a reason such that the installation surface 920 vibrates into the horizontal direction, the each four foot member 402 stretches to and deforms into the gravitational direction as shown by arrow a. Since the respective four suspending members 352 stretches to and deforms into the gravitational direction, the support part 100 moves into the circumferential direction about the center of the circle 954 with respect to the installation surface 920 as shown by arrow b.

In this moment, the support part 100 moves into the circumferential direction in the state that the gravity is applied to the carrying part 200, thus the four suspending members 352 stretch and contract and the foot member 354 deforms into the horizontal direction and the gravitational direction. Since the four suspending members 352 stretch and the foot member 354 deforms into the horizontal direction and the gravitational direction, the carrying part 200 moves into the circumferential direction about the foot member 354 as its center (about the center of the circle 952 as its center) with respect to the support part 100 as shown by arrow c. And this circumferential direction movement of the carrying part 200 cancels the circumferential direction movement of the support part 100. In this way in the antivibration device 10 according to the first embodiment, the horizontal direction vibration applied to the antivibration device 10 is canceled by converting the horizontal direction vibration which is applied to the antivibration device 10 into two circumferential direction movements which are composed of the circumferential direction movement of the support part 100 with respect to the installation surface 920 and the circumferential direction movement of the carrying part 200 with respect to the support part 100.

In the above description, it is explained as an example that both the suspending members 352 and the foot member 354 are viscoelastic body, however, the connecting mechanism 300 may have at least one second viscoelastic body 350. For this purpose, if the foot member 354 is viscoelastic body, the suspending members 352 need not be viscoelastic. Instead, a string type member and a rod type member can be used as the suspending members 352. Further, since the connecting mechanism 300 needs to have at least one second viscoelastic body, the foot member 354 need not be a viscoelastic body if the suspending members 352 are viscoelastic body.

Figure 4:
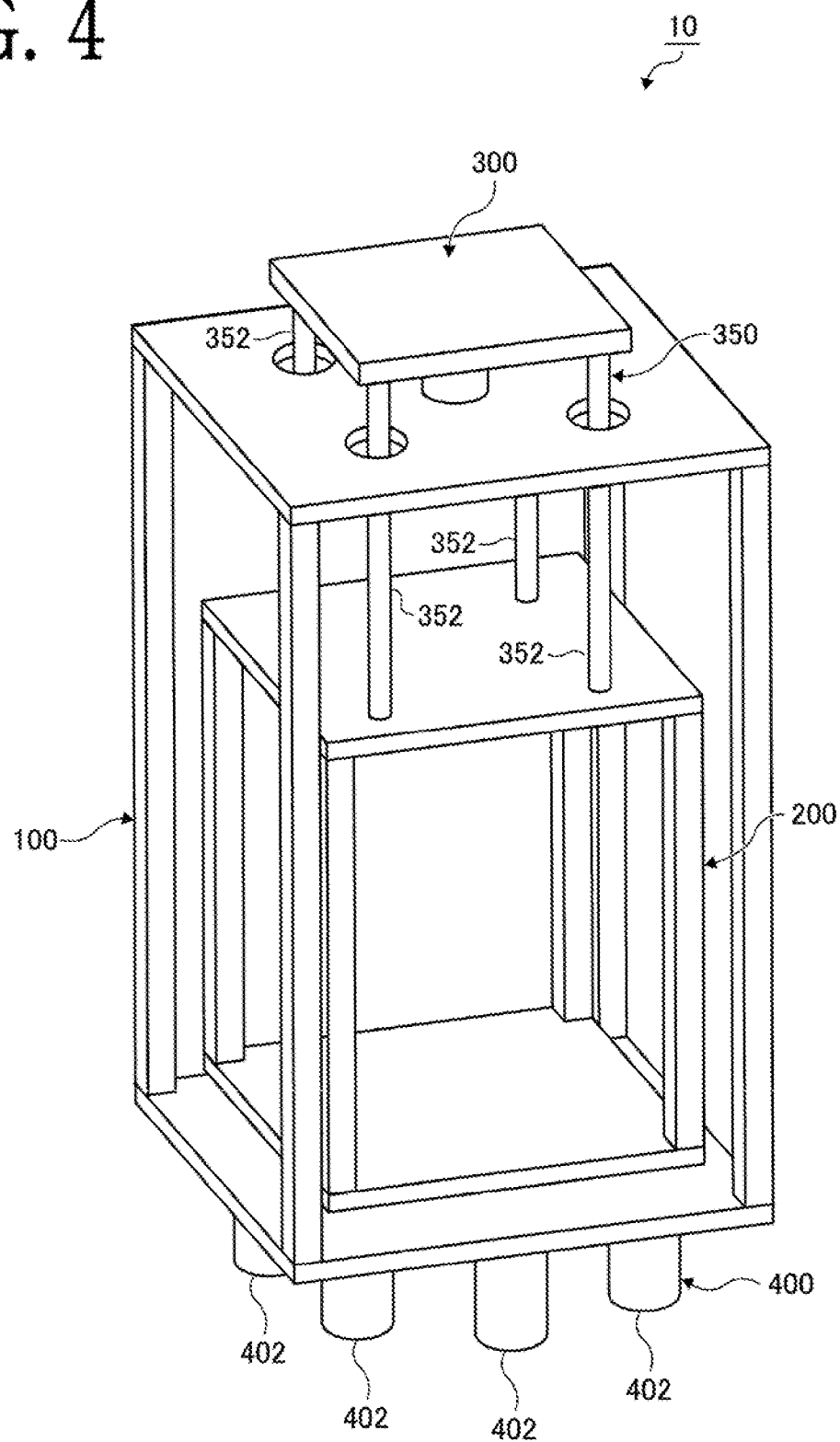
FIG. 4 shows a perspective view depicting an antivibration device according to the second embodiment of the present invention.
Figure 5A:
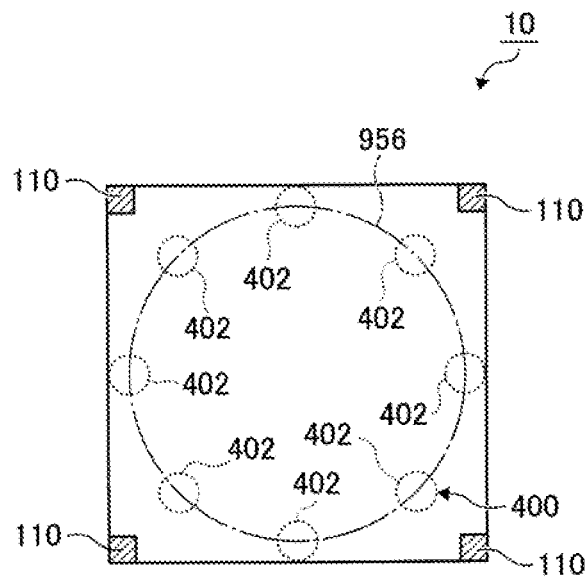
FIG. 5A shows a cross-sectional view at the A-A line cross section in FIG. 5B.
Figure 5B:
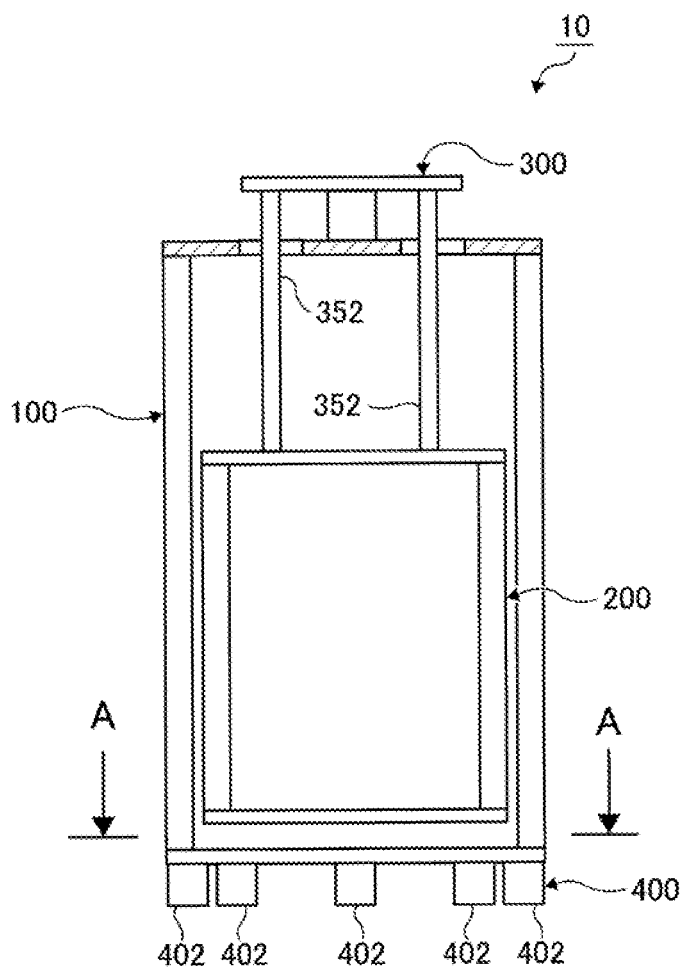
FIG. 5B shows a side elevational view.

FIGS. 4 and 5 show an antivibration device 10 according to the second embodiment of the present invention. The difference of the antivibration device 10 according to the second embodiment from the antivibration device 10 according to the first embodiment will be explained hereinafter.

The antivibration device 10 according to the aforementioned first embodiment has four foot members 402 used as the first viscoelastic body 400. In contrast, the antivibration device 10 according to the second embodiment has eight foot members 402. The eight foot members 402 are placed on a circumference of one circle 956 at equal intervals. The circle 956 is arranged so as to be concentric to the circle 952 to which circumference the four through holes 106 are arranged. Since the rest of the parts except for the part described in the above are the same with the antivibration device 10 according to the aforementioned first embodiment, thus the explanation thereof will be omitted.

Figure 6:
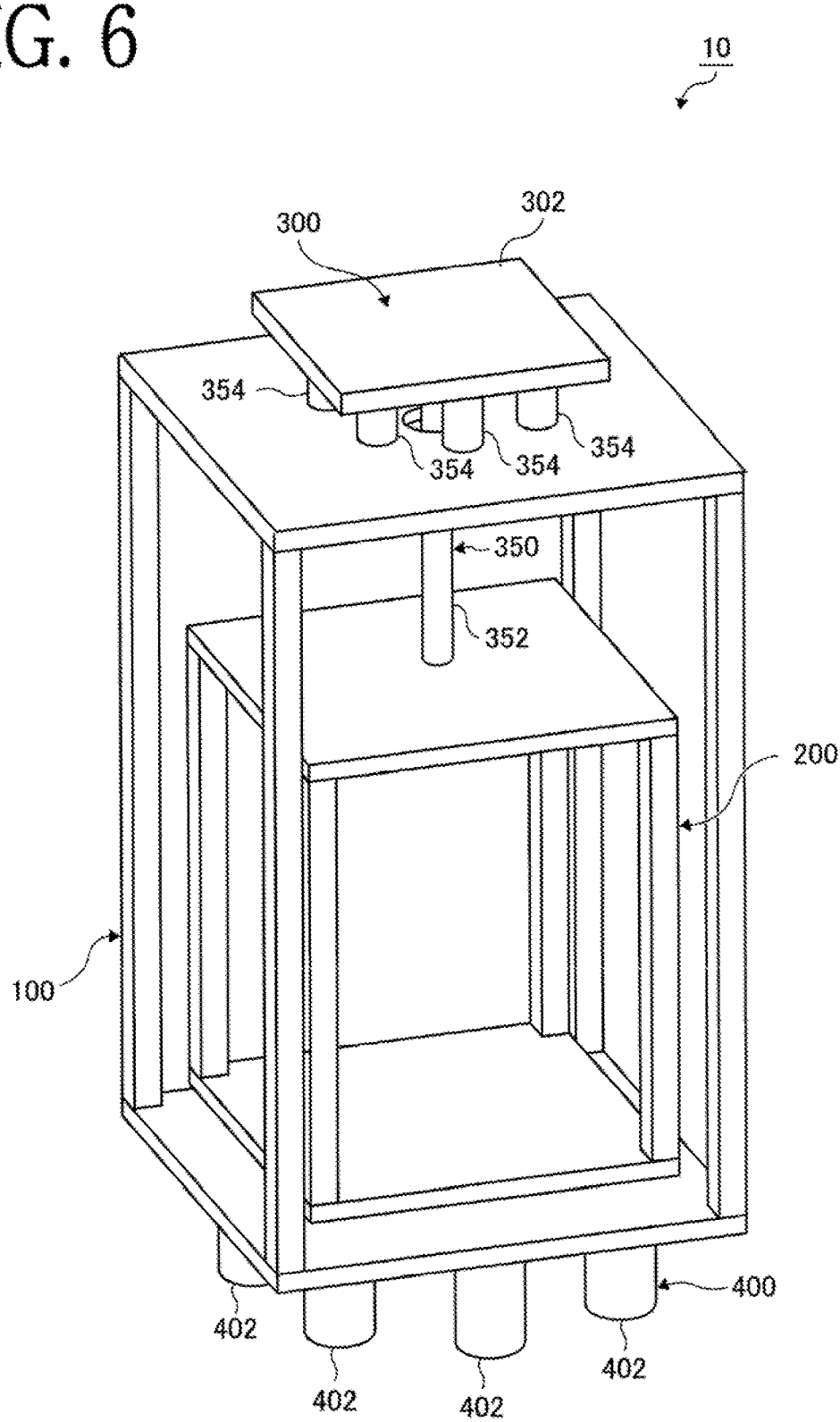
FIG. 6 shows a perspective view depicting all antivibration device according to the third embodiment of the present invention.
Figure 7A:
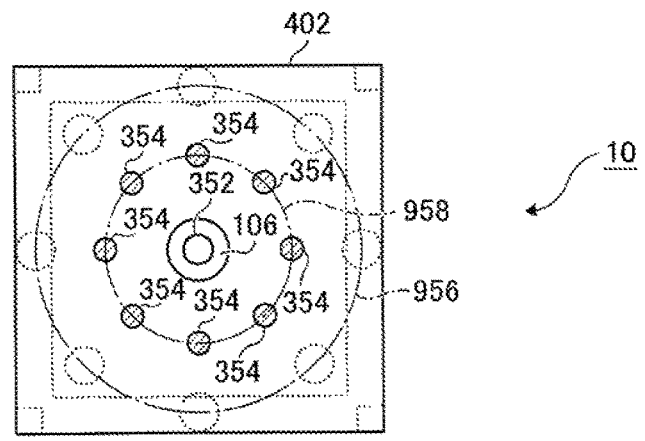
FIG. 7A shows a cross-sectional view at the B-B line cross section in FIG. 7B.
Figure 7B:
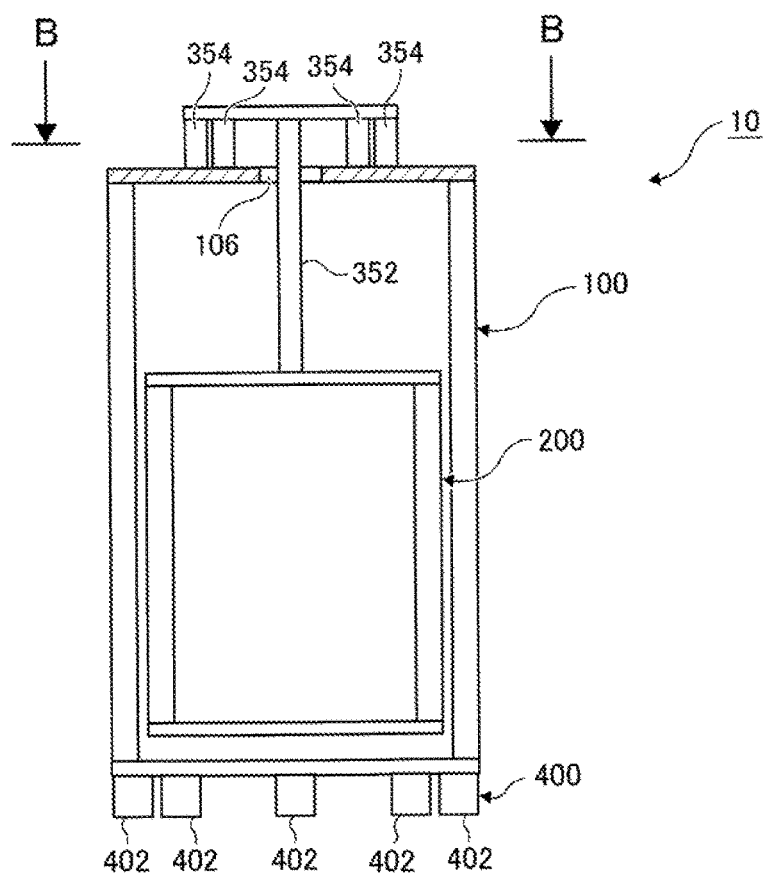
FIG. 7B shows a side elevational view.

FIGS. 6 and 7 show an antivibration device 10 according to the third embodiment of the present invention. The difference of the antivibration device 10 according to the third embodiment from the antivibration device 10 according to the first embodiment will be explained hereinafter.

The antivibration device 10 according to the aforementioned first embodiment has four foot members 402 used as the first viscoelastic body 400. In contrast, the antivibration device 10 according to the third embodiment has eight foot members 402 as the same with the antivibration device 10 according to the second embodiment. The eight foot members 402 are placed on a circumference of one circle 956 at equal intervals.

Further, the antivibration device according to the aforementioned first embodiment has four suspending members 352 and one foot member 354 as the second viscoelastic body 350. In contrast, the antivibration device 10 according to the third embodiment has one suspending members 352 and the eight foot member 354 as the second viscoelastic body 350. The eight foot members 354 are placed on a circumference of one circle 958.

Since one suspending members 352 is used, thus one through hole 106 is formed in the top plate 104 of the antivibration device 10 in the third embodiment while four through holes 106 are formed in the first embodiment. The through hole 106 is formed so as to locate at the center of the circle 958. Since the rest of the parts except for the part described in the above are the same with the antivibration device 10 according to the aforementioned first embodiment, thus the explanation thereof will be omitted.

In the antivibration device 10 according to the third embodiment, the connecting mechanism 300 may have at least one second viscoelastic body 350 as the same manner with the antivibration device 10 according to the aforementioned first embodiment. For this purpose, if the foot member 354 is viscoelastic body, the suspending members 352 need not be viscoelastic, and if the suspending members 352 is a viscoelastic body, the foot member 354 need not be a viscoelastic body.

Figure 8:
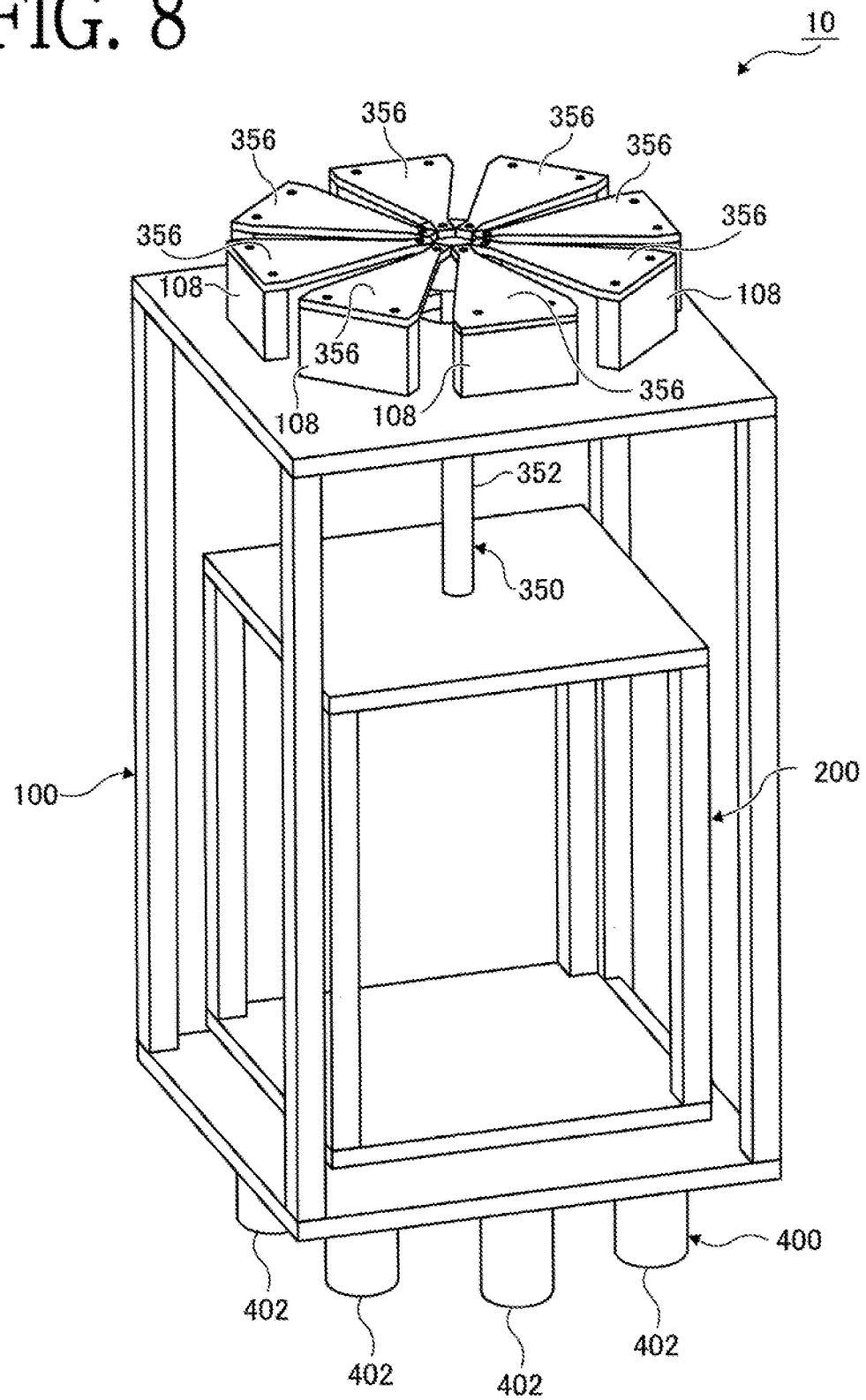
FIG. 8 shows a perspective view depicting an antivibration device according to the fourth embodiment of the present invention.
Figure 9A:
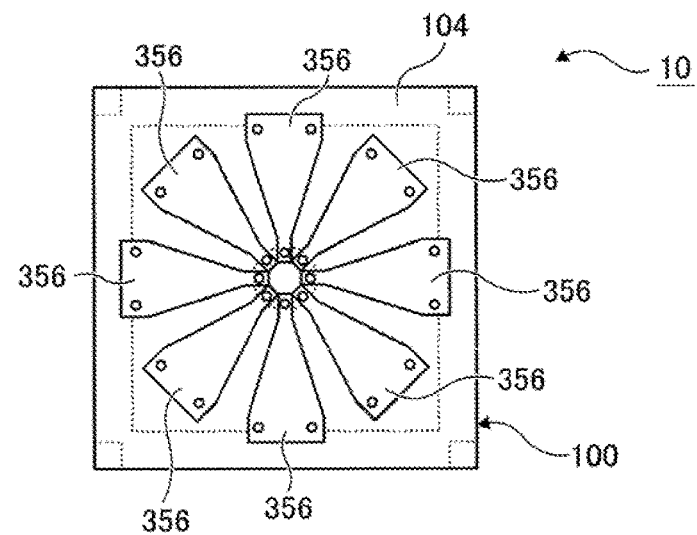
FIG. 9A shows a plan view.
Figure 9B:
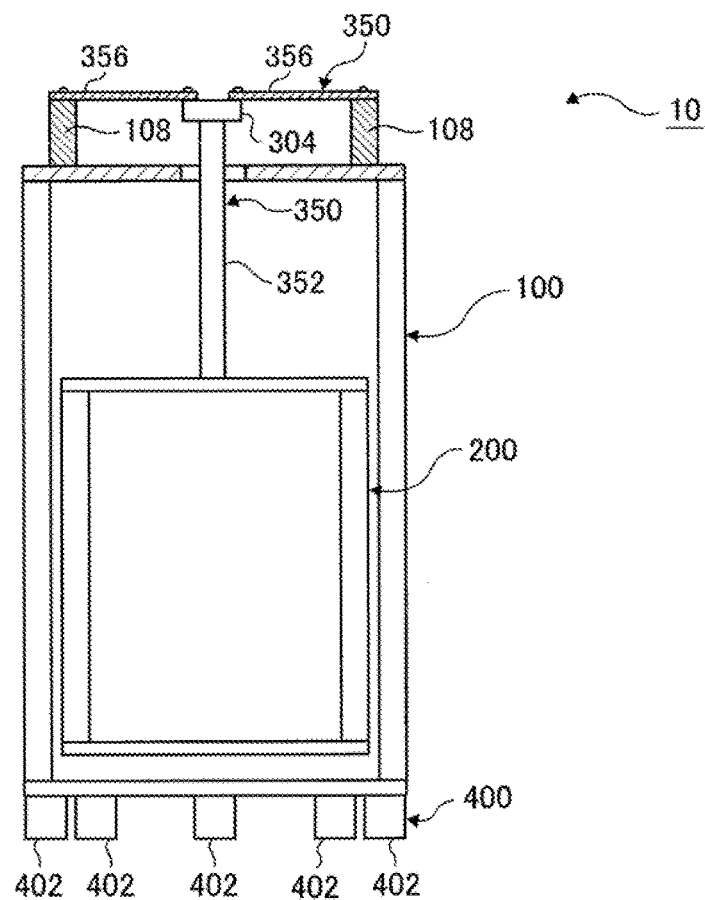
FIG. 9B shows a side elevational view.

FIGS. 8 and 9 show an antivibration device 10 according to the fourth embodiment of the present invention. The difference of the antivibration device 10 according to the fourth embodiment from the antivibration device 10 according to the first embodiment will be explained hereinafter.

The antivibration device 10 according to the aforementioned first embodiment has four foot members 402 used as the first viscoelastic body 400. In contrast, the antivibration device 10 according to the fourth embodiment as eight foot members θ2 as the same with the antivibration device 10 according to the aforementioned second embodiment and the antivibration device 10 according to the aforementioned third embodiment. The eight foot members 402 are placed on a circumference of one circle 956 at equal intervals (the illustration is committed in FIGS. 8 and 9; refer to FIGS. 5 and 7).

Further, the antivibration device 10 according to the aforementioned first embodiment has the suspending plate 302 used as the suspending part, the four suspending members 352 used as the second viscoelastic body 350, and one foot member 354 used as the second viscoelastic body 350 as well. In contrast, the antivibration device 10 according to the fourth embodiment has a suspending member 304 used as the suspending part, one suspending members 352 such as coil spring used as the second viscoelastic body, and, e.g., eight plate spring members 356 used as the second viscoelastic body as well.

The suspending frame member 304 is, for example, a cylindrical member and one suspending members 352 is attached to the lower surface of the suspending frame member 304 in the gravitational direction. Further, since one suspending members 352 is used, thus one through hole 106 is formed in the top plate 104 of the antivibration device 10 in the fourth embodiment while four through holes 106 are formed in the first embodiment.

As the plate spring member 356, for example, a plate-shaped and wedge-shaped metal is used. Each plate spring member 356 is attached at one end part thereof to an upwardly directed surface of the projected part 10 which is attached to the upwardly directed surface of the top plate 104 in the gravitational direction so as to project from the upwardly directed surface 104. Further, the other end part of the plate spring member 356 is attached to the upwardly directed surface of the suspending frame member 304. In the antivibration device 10 according to the fourth embodiment, the suspending frame member 304 used as the suspending part which suspends the carrying part 200 is suspended by the plurality of plate spring members 356 used as the second viscoelastic body 350.

At least two plate spring members 356 may be used as the plate spring members 356; except for eight plate spring members 356, e.g. two to seven, also may be used. Further, in the antivibration device 10 according to the fourth embodiment, the connecting mechanism 300 may have at least one second viscoelastic body 350 as the same manner with the antivibration device 10 according to the aforementioned first embodiment. For this purpose, since the plate spring member 356 is viscoelastic body, the suspending members 352 need not be a viscoelastic body. For this purpose, a string type member which does not stretch and a rod type member can be used as the suspending member 352 alternative to using the coil spring etc. Since the rest of the parts except for the part described in the above are the same with the antivibration device 10 according to the aforementioned first embodiment, thus the explanation thereof will be omitted.

Figure 10:
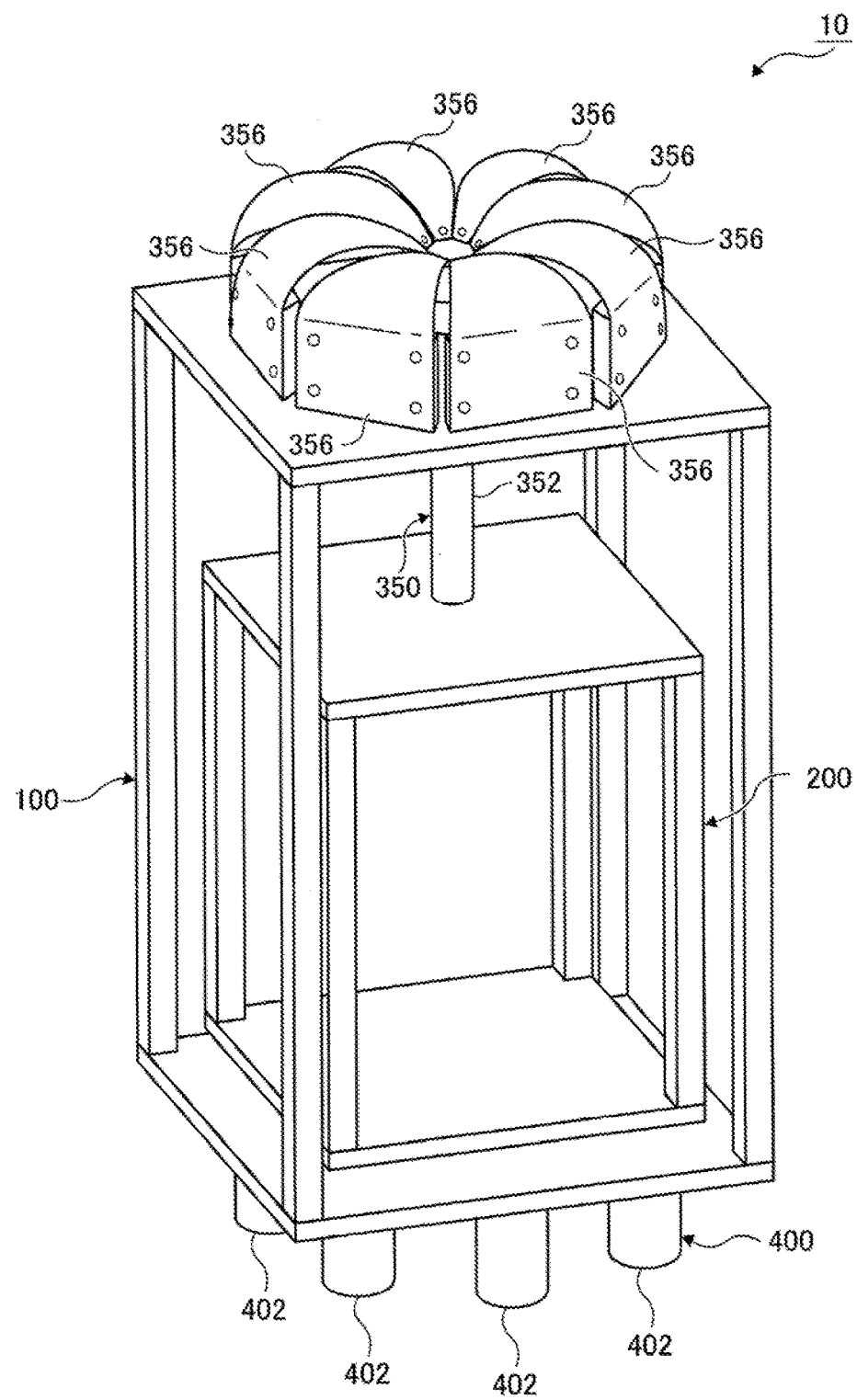
FIG. 10 shows a perspective view depicting antivibration device according to the fifth embodiment of the present invention.
Figure 11A:
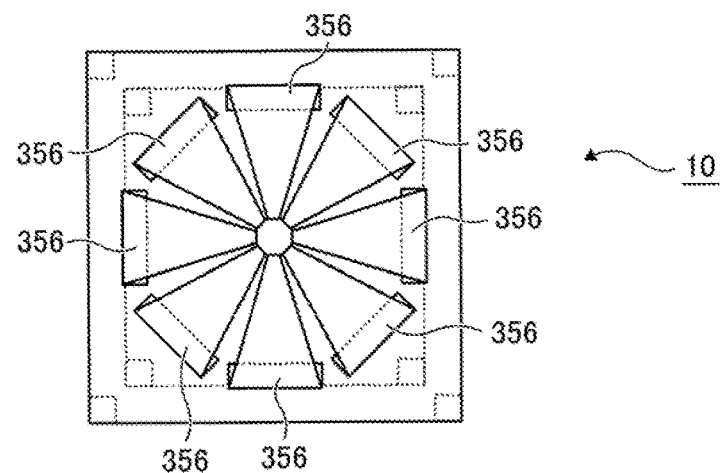
FIG. 11A shows a plan view.
Figure 11B:
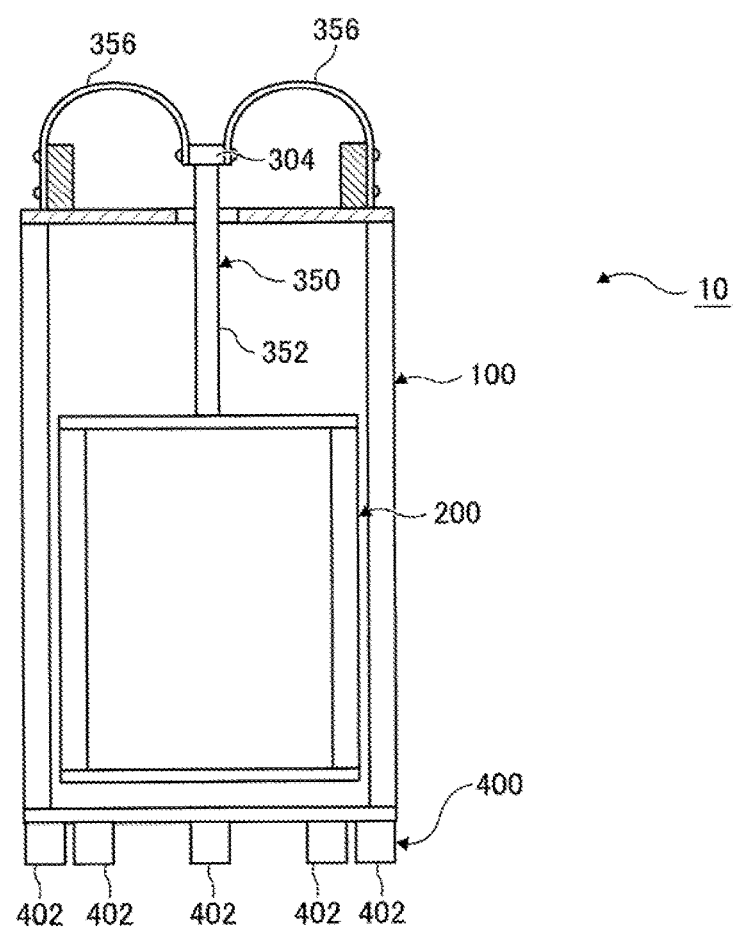
FIG. 11B shows a side devotional view.

FIGS. 10 and 11 show an antivibration device 10 according to the fifth embodiment of the present invention. The difference of the antivibration device 10 according to the fifth embodiment from the antivibration device 10 according to the fourth embodiment will be explained hereinafter.

In the aforementioned antivibration device 10 according to the fourth embodiment, one end part of the each plate spring member 356 is attached to the upwardly directed surface of the projected part 108 while the other end part of the each plate spring member 356 is attached to the upwardly directed surface of the suspending frame member 304. In contrast, in this fifth embodiment, one end part of the each plate spring member 356 is attached to an approximately vertical surface of the projected part 108 opposite to a surface thereof facing toward the suspending frame member 304 while the other end part of the each plate spring member 356 is attached to an approximately vertical surface of the suspending frame member 304. Since the rest of the parts except for the part described in the above are the same with the antivibration device 10 according to the aforementioned fourth embodiment, thus the explanation thereof will be omitted.

Figure 12:
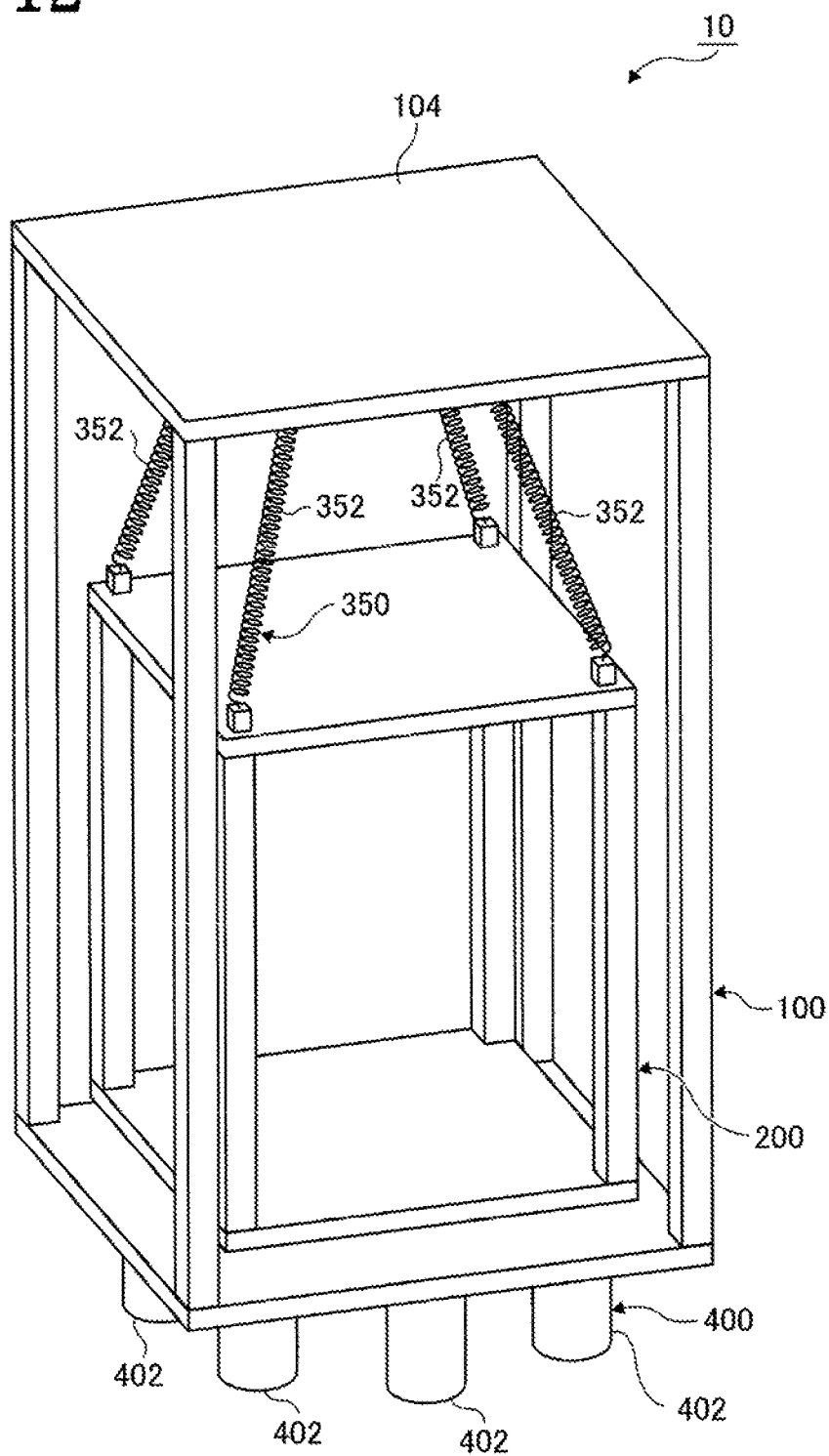
FIG. 12 shows a perspective view depicting an antivibration device according to the sixth embodiment of the present invention.
Figure 13A:
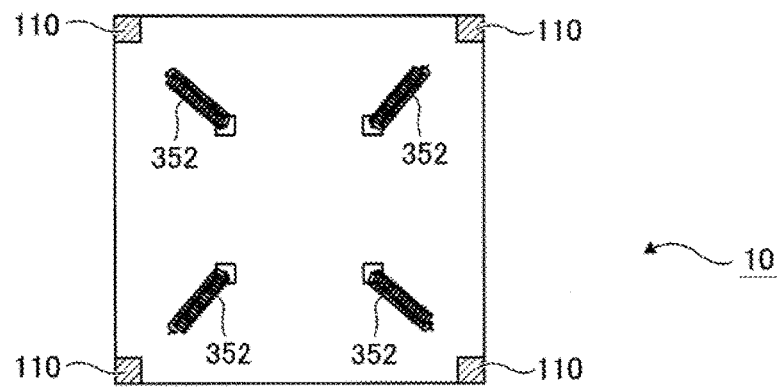
FIG. 13A shows a cross-sectional view at the line C-C line cross section in FIG. 13B.

FIGS. 12 and 13 show an antivibration device 10 according to the sixth embodiment of the present invention. The difference of the antivibration device 10 according to the sixth embodiment from the antivibration device 10 according to the first embodiment will be explained hereinafter.

The antivibration device 10 according to the aforementioned first embodiment has four foot members 402 used as the first viscoelastic body 400. In contrast, the antivibration device 10 according to the sixth embodiment has eight foot members 402 as the same with the antivibration device according to the aforementioned second embodiment. The eight foot members 402 are placed on a circumference of one circle 956 at equal intervals (the illustration is committed in FIGS. 12 and 13; refer to FIGS. 5 and 7).

Further, the antivibration device 10 according to the aforementioned first embodiment has the suspending plate 302 used as the suspending part, the four suspending members 352 used as the second viscoelastic body 350, and one foot member 354 used as the second viscoelastic body 350 as well. In contrast, the antivibration device 10 according to the sixth embodiment does not have the suspending plate 302 or foot member 354, but has four suspending members 352 used as the second viscoelastic body.

The suspending members 352 suspend the carrying part 200 therefrom. More specifically, one end parts 352a of the suspending members 352 are attached to the upper surface of the top plate 204 of the carrying part 200 while the other end parts 352b of the suspending members 352 are attached to the lower surface of the top plate 104 of the support part 100, thus the four suspending members 352 suspend the carrying part 200 therefrom.

Further, the four suspending members 352 are placed so that segments of lines L each extending from the one end part 352a to the other end part 352b intersect each other at one point P. At least three suspending members 352 may be used, and any number of the suspending members except for four such as three and five also may be used. In any case that the number of the suspending members 352 is other than four, it is needed that the plurality of the suspending members 352 are placed so that segments of lines L each extending from the one end part 352a to the other end part 352b of each suspending member 352 intersect each other at one point P. Since the rest of the parts except for the part described in the above are the same with the constitution of the antivibration device 10 according to the aforementioned first embodiment, thus the explanation with regard to the same constitution thereof will be omitted.

FIG. 14 shows how the anti vibration device 10 according to the sixth embodiment works. FIG. 14A shows the antivibration device 10 in a state that no vibration is applied thereto. FIG. 14B shows the antivibration device 10 in a state that vibration is applied thereto. For example, when horizontal direction vibration is applied to the antivibration device 10 in the state shown in FIG. 14A in a reason such that the installation surface 920 vibrates into the horizontal direction, the each of the plurality of foot members 402 stretches to and deforms into the gravitational direction as shown by arrow a. Since the respective four suspending members 352 stretches to and deforms into the gravitational direction, the support part 100 moves into the circumferential direction with respect to the installation surface 920 as shown by arrow b.

In this moment, the support part 100 moves into the circumferential direction in the state that the gravity is applied to the carrying part 200, thus the four suspending members 352 stretch and contract. Since the four suspending members 352 stretch and contract, the carrying part 200 starts a swaying motion swaying into the circumferential direction about the point p as a virtual center. And this swaying motion of the carrying part 200 swaying into the circumferential direction cancels the circumferential direction movement of the support part 100. In this way, in the antivibration device 10 according to the sixth embodiment, the horizontal direction vibration applied to the antivibration device 10 is canceled by converting the horizontal direction vibration which is applied to the antivibration device 10 into two movements which are composed of the circumferential direction movement of the support part 100 with respect to the installation surface 920 and the swaying motion of the carrying part 200 swaying into the circumferential direction about the point p as its virtual center.

Figure 15A:
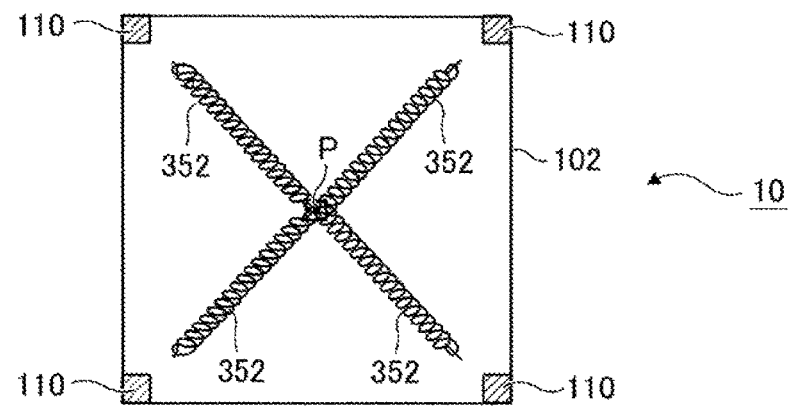
FIG. 15A shows a cross-sectional view at the line D-D cross section.
Figure 15B:
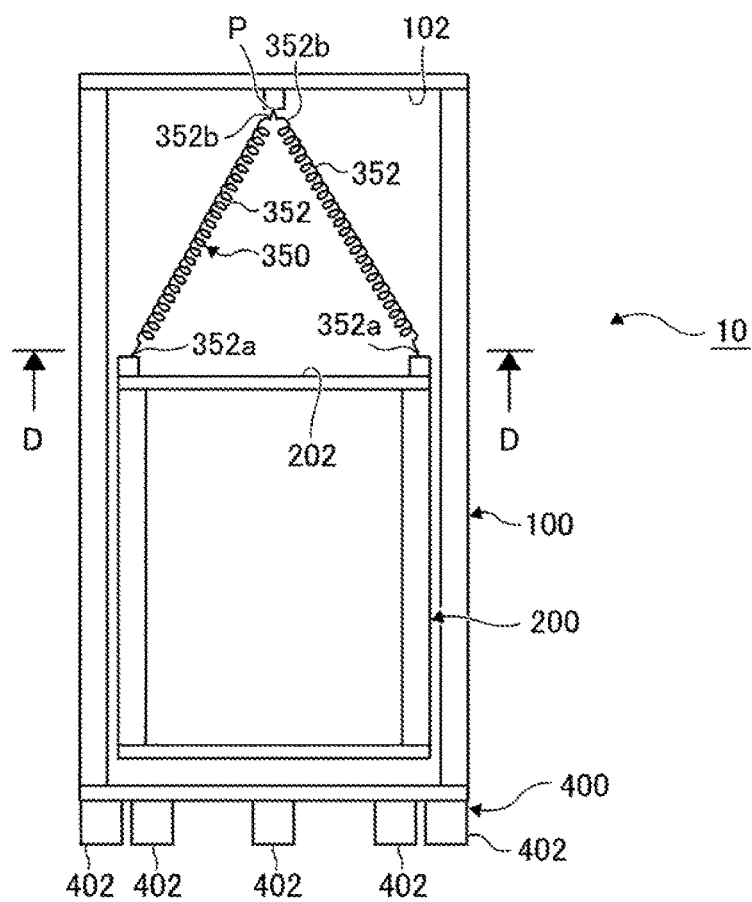
FIG. 15B shows a side elevational view.

FIG. 15 shows an antivibration device 10 according to the seventh embodiment of the present invention. The difference of the antivibration device 10 according to the seventh embodiment from the antivibration device 10 according to the sixth embodiment will be explained hereinafter.

Figure 13B:
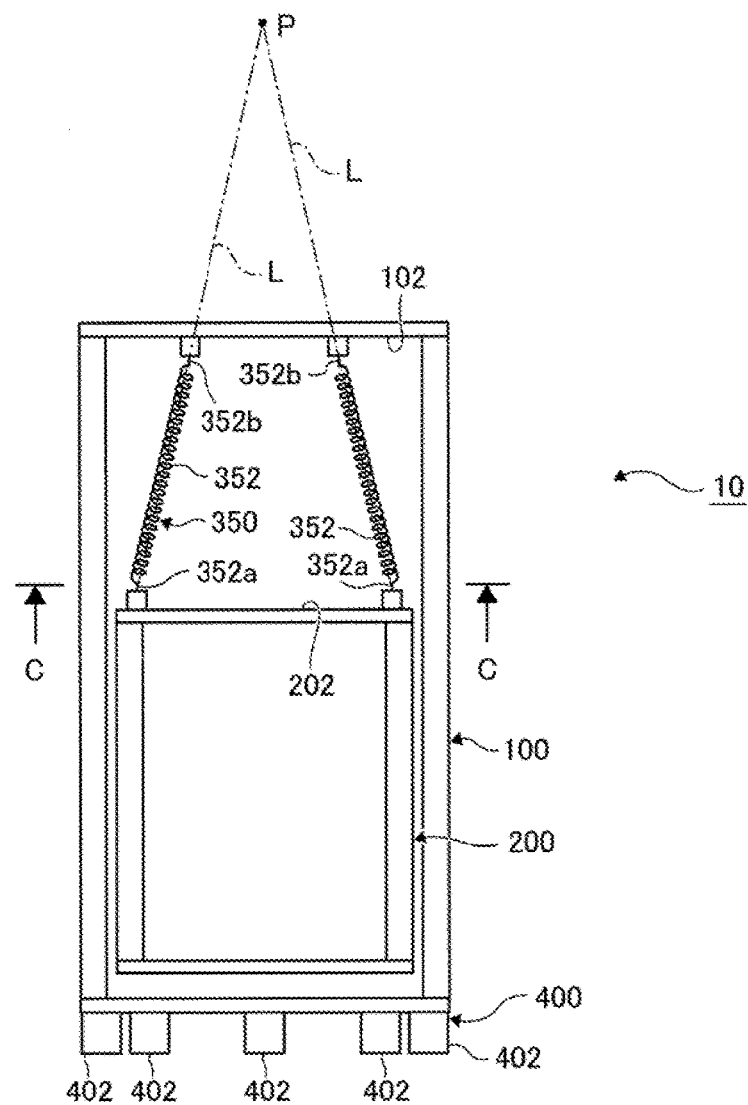
FIG. 13B shows a side elevational view.

In the aforementioned antivibration device 10 according to the sixth embodiment, the four suspending members 352 are placed so that the segments of lines L each extending from the one end part 352a to the other end part 352b of each four suspending member 352 intersect each other at one point p, which point p is located above the top plate 104 (refer to FIG. 13B). In contrast, in the antivibration device 10 according to the seventh embodiment, each one end part 352a of four suspending members 352 is attached to the upper surface of the top plate 204 of the carrying part 200 while the other end 352b thereof is supported by a point p which is one point on the top plate 104 of the support part 100.

In the antivibration device 10 according to the seventh embodiment, when the support part 100 starts the circumferential movement by applying the horizontal direction vibration to the antivibration device 10 (refer to FIG. 14), the carrying part 200 starts the circumferential direction movement rotating about the point P as its center since each suspending member 352 stretches and contracts. And this circumferential direction movement of the carrying part 200 cancels the circumferential direction movement of the support part 100. Since the rest of the parts except for the part described in the above are the same with the antivibration device 10 according to the aforementioned sixth embodiment, thus the explanation thereof will be omitted.

Figure 16A:
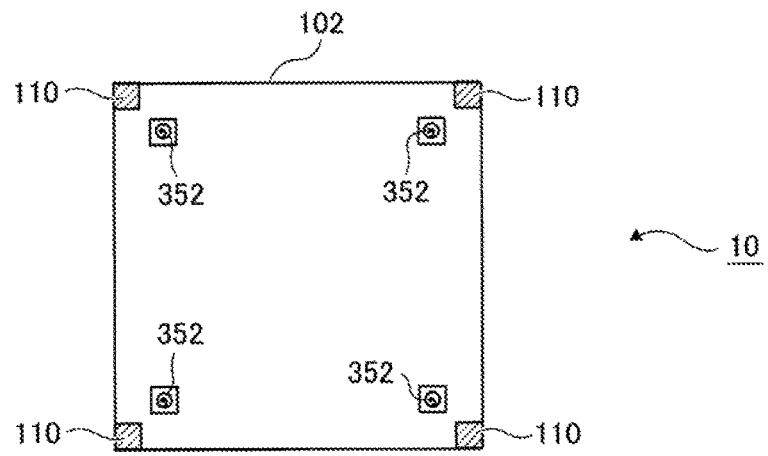
FIG. 16A shows a cross-sectional view at the line E-E line cross section in FIG. 16B.
Figure 16B:
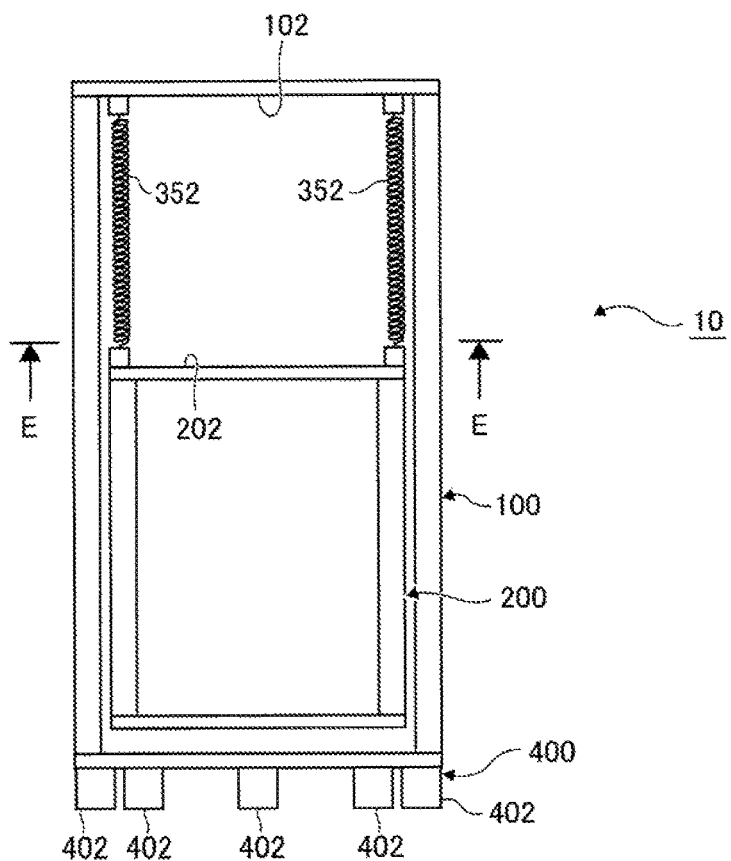
FIG. 16B shows a side devotional view.

FIG. 16 shows an antivibration device 10 according to a comparative example. The difference of the antivibration device 10 according to the comparative example from the antivibration device 10 according to the sixth embodiment will be explained hereinafter.

In the aforementioned antivibration device 10 according to the sixth embodiment, the four suspending members 352 are placed so that the segments of lines L each extending from the one end part 352a to the other end part 352b of each four suspending member 352 intersect each other at one point p. In contrast, in this comparative example, the four suspending members 352 are in parallel each other.

In the antivibration device 10 according to this comparative example, when the support part 100 starts the circumferential direction movement by applying the horizontal direction vibration to the antivibration device 10, the carrying part 200 does not circumferentially move even though each suspending member 352 stretches and contracts, thus the movement of the support part 100 cannot be canceled.

Figure 17:
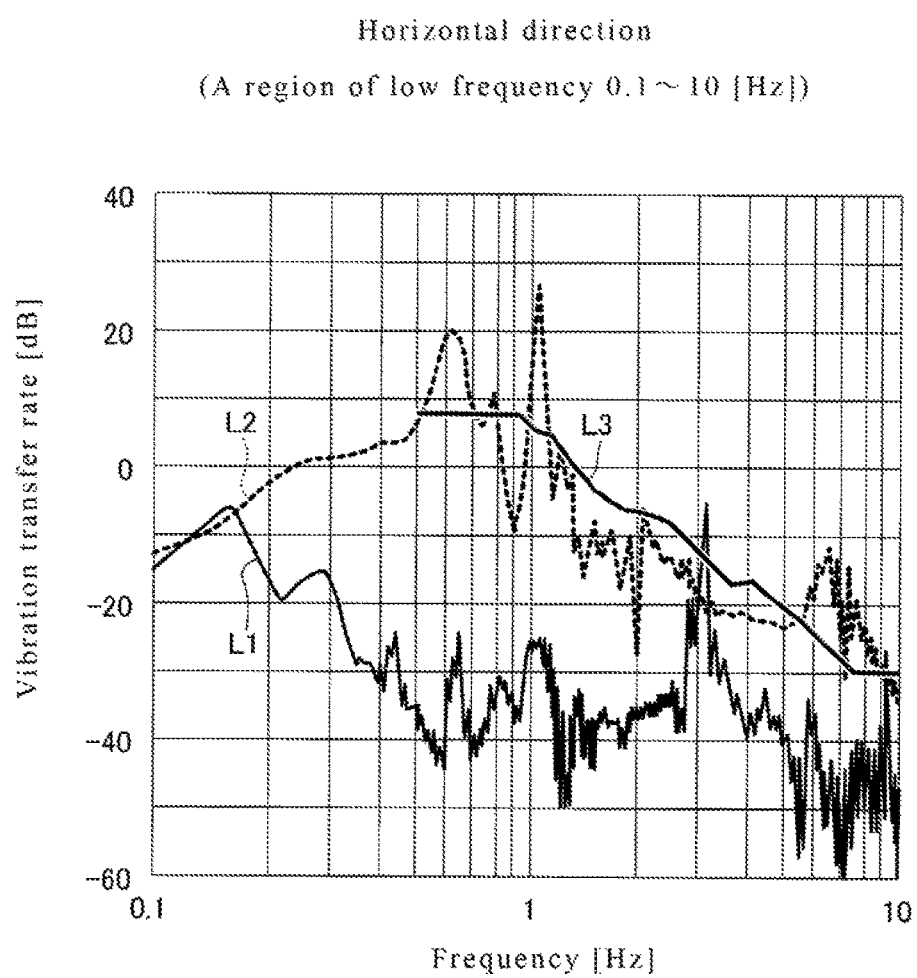
FIG. 17 shows a graphs depicting the effect of the present invention.

FIG. 17 shows a graphs showing the effect of the present invention, and shows that the vibration transfer rate of the antivibration device 10 (refer to FIGS. 12 to 14) according to the sixth embodiment of the present invention comparing with the vibration transfer rate of the antivibration device 10 (refer to FIG. 16) according to the comparative example and also comparing with the vibration transfer rate of an active antivibration table. In FIG. 17, the horizontal axis shows a vibration frequency of the installation surface 920 in the horizontal direction while the vertical axis shows a ratio of a vibration of the carrying part 200 in the horizontal direction to a vibration of the installation surface 920 in the horizontal direction. More specifically, the vertical axis shows:

Vibration Transfer Rate (dB)=20×Log 10 (vibration of the carrying part 200/vibration of the installation surface 920)

Further, in FIG. 17, the line L1 shows the vibration characteristic of the antivibration device 10 according to the sixth embodiment of the present invention; the line L2 shows the vibration characteristic of the antivibration device 10 according to the comparative example; and the line L3 shows a vibration characteristic of a general active anti vibration table. Here, the active antivibration table is a device for detecting vibration by means of vibration sensor and for moving the mounted part onto which a target object for antivibration is mounted so as to chancel the detected vibration by means of an actuator.

As shown in FIG. 17, although the vibration transfer rate of the antivibration device 10 according to the sixth embodiment of the present invention is larger than the vibration transfer rate of the antivibration device according to the comparative example at a frequency around 3 [Hz], however, the vibration transfer rate of the antivibration device according to the sixth embodiment of the present invention is smaller than the vibration transfer rate of the antivibration device according to the comparative example and the vibration transfer rate of a general active antivibration table at a frequency from 1 to 1.1 [Hz] and from 3 to 10 [Hz].

Figure 18:
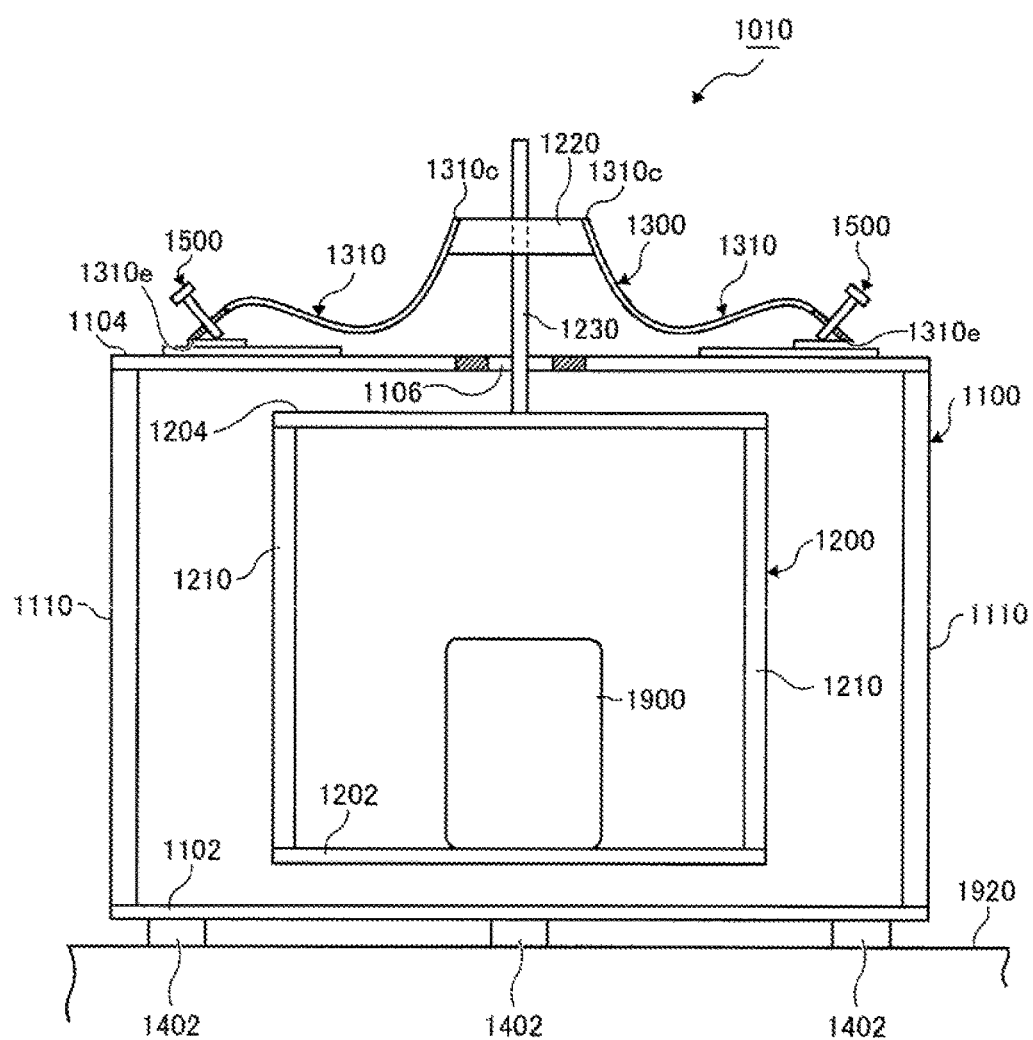
FIG. 18 shows a side elevational view depicting an antivibration device according to the eighth embodiment of the present invention.

FIG. 18 shows an antivibration device 1010 according to the eighth embodiment of the present invention. The antivibration device 1010 is a device for restraining, preferably, for suppressing the vibration of a target object 1900 for antivibration and has, as shown in FIG. 18, a support part 1100, a carrying part 1200, a connecting mechanism 1300, and foot members 1402.

The support part 1100 is a structure for supporting the carrying part 1200, has a bottom plate 1102 and a top plate 1104; and the bottom plate 1102 and the top plate 1104 are connected by, for example, the four post members 1110 (only two thereof are shown in FIG. 18) thereby forming a frame body. The top plate 1104 is formed with a through hole 1106, for example, at the center part thereof.

The foot members 1402 are used as a horizontal antivibration part for restraining, preferably, for suppressing the horizontal vibration of the target object 1900 for antivibration and support the carrying part 1200 from the lower side in the gravitational direction. The foot members 1402 is attached at its upper end part to the downwardly directed surface of the bottom plate 1102 and the bottom ends thereof contact with the installation surface 1920 in a state that the antivibration device 1010 is mounted on the installation surface 1920. As the foot members 1402, a plurality of members are used, for example, four members (only three members are shown in FIG. 18).

Further, the foot members 1402 are the members for allowing the support part 1100 to move in the circumferential direction with respect to the installation surface 1920 and as for the foot members 1402, for example, a cylindrical rubber block and a coil spring can be used. Any viscoelastic body which stretches and contracts in the horizontal direction can be used as the foot member 1402, and other member also can be used as an alternative to the rubber block and the coil spring. The foot members 402 do not need to have four members in number but can have at least one member.

The carrying part 1200 is a structure body onto which the target object 1900 for antivibration is mounted. Apparatuses in which an accuracy in nanometer order come to be an issue can be raised as for the target object 1900 for antivibration, which apparatuses are e.g. an exposure machine for forming circuit patterns for electronic devices used in computers and communication equipments, a three-dimensional shape measuring device for measuring fine shape of optical devices used for optical measurement making use of a blue laser, and an electron microscope used for genetic analysis etc. The carrying part 1200 has a bottom plate 1202 and a top plate 1204, and the top plate 1204 and the bottom plate 1202 are connected by, for example, the four post members 1210 (only two members are shown in FIG. 18) thereby forming a frame body. As shown in FIG. 18, the target object 1900 for antivibration is placed on an upwardly directed surface of the bottom plate 1202 in the gravitational direction.

Further, the carrying part 1200 has an attachment member 1220 to which an end part 1310c side of the plate spring member 1310 described later is attached, and a fixing member 1230 for fixing the attachment member 1220 to the top plate 1204. The attachment member 1220 is a plate-shaped member for example, and is placed above the top plate 1104 in the gravitational direction and above the through hole 1106 in the gravitational direction. The fixing member 1230 is a rod type member for example and is placed so as to penetrate through the through hole 1106; and the bottom end side thereof is fixed to the top plate 1204 while the top end side thereof is fixed to the attachment member 1220.

The connecting mechanism 1300 is a mechanism for connecting the support part 1100 with the carrying part 1200 and has two plate spring members 1310 for example used as at least two elastic bodies. The two plate spring members 1310 are used as elastic bodies in which the ends 1310c side are attached to the carrying part 1200 while the ends 1310e side are attached to the support part 1100, respectively. More specifically, the end 1310c sides of the two plate spring members 1310 are attached to the attachment member 1220 of the carrying part 1200 while the end 1310e sides thereof are attached to the top plate 1104 of the support part 1100 via adjustment mechanisms 1500 described later. In this embodiment, although the connecting mechanism 1300 has two plate spring members 1310, however, the connecting mechanism 1300 may have at least two plate spring members 1310, and the connecting mechanism 1300 may also have three or more plate spring members 1310 (refer to FIG. 29).

As shown in FIG. 18, the antivibration device further has adjustment mechanisms 1500. The adjustment mechanisms 1500 are used as position adjustment mechanisms for changing the positions where the plate spring members 1310 are attached to the support part 1100 and are used as angle adjustment mechanisms for changing the angle θ (refer to FIG. 19) for attaching the plate spring members 1310 to the support part 1100. The number of the adjustment mechanisms 1550 is the same number of the plate spring members 1310. In this embodiment, two adjustment mechanisms are provided. The adjustment mechanisms 1550 will be precisely described later.

Figure 19:
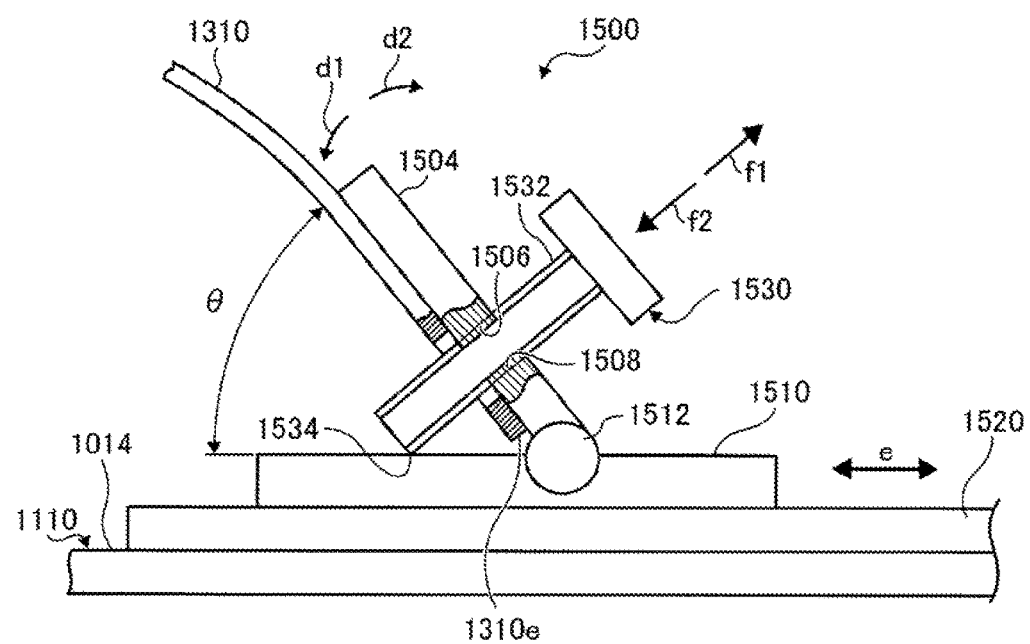
FIG. 19 shows a schematic side elevational view of an adjusting mechanism included by the antivibration device depicted by FIG. 18.

FIG. 19 shows one adjustment mechanism 1550. As shown in FIG. 19, the adjustment mechanism 1550 has an attachment plate 1504, a movable member 1510, and a rail member 1520. The attachment plate 1504 is the member to which the end part 1310e side opposite to the side being attached with the attachment member 1220 of the plate spring member 1310 (refer FIG. 18) is attached, and is attached to the movable member 1510 so as to rotate about a hinge 1512 by making use of the hinge 1512. A plurality of screw members (not shown), for example, are used for attaching the plate spring member 1310 against the attachment plate 1504.

Further, the attachment plate 1504 is formed with a through hole 1506, and the through hole 1506 is formed with internal threads so that a screw member 1530 mentioned below engages therewith. The arrow d1 and the arrow d2 shown in FIG. 19 show a direction in which the attachment plate 1504 rotates about the hinge 1512.

The rail member 1520 is used as a guide means for guiding the movement of the movable member 1510 and is fixed to the top plate 1104 of the support part 1100.

The movable member 1510 can move, so as to be guided by the rail member 1520, in a direction drawing close to the attachment member 1220 and the fixing member 1230 (refer FIG. 18, respectively) and in a direction apart from the attachment member 1220 and the fixing member 1230. Further, the movable member 1510 is provided with a screw member (not shown) for fixing the movable member 1510 to the rail member 1520; and by making use of the screw member, the movable member 1510 which completes the movement to an intended position is fixed to the rail member 1520. The arrow "e" shown in FIG. 19 indicates the direction toward which the movable member 1510 moves.

The adjustment mechanism 1550 further has a screw member 1530 which is formed with external threads 1532 thereon. The screw member 1530 is attached to the attachment plate 1504 so that the external threads 1532 engage with internal threads 1508. Further, the screw member 1530 restricts the rotation of the attachment plate 1504 and the plate spring member 1310 toward the direction of the arrow d1 occurred by the action of gravity since the distal end part 1534 contacts with the movable member 1510. Further, the screw member 1530 moves in the direction of the arrow f1 and the direction of the arrow f2 shown in FIG. 19 with respect to the attachment plate 1504 by a rotational manipulation.

Figure 20:
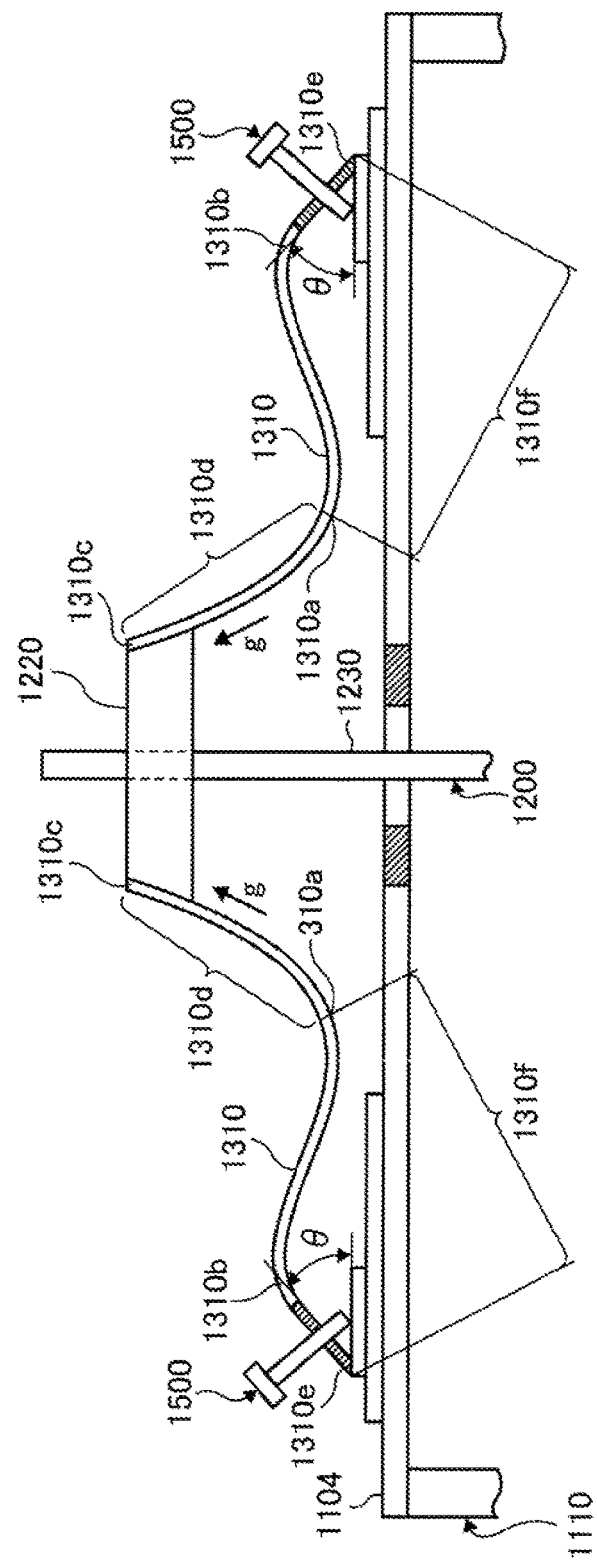
FIG. 20 shows an enlarged view of elastic bodies included by the antivibration device depicted by FIG. 18.

FIG. 20 shows the plate spring members 1310 in an enlarged manner. As shown in FIG. 20, the each plate spring member 1310 curves so as to have two inflexion points 1310a, 1310b. Although the plate spring member 1310 curves so as to have the two inflexion points in this embodiment, however, the plate spring member 1310 may curve so as to have at least two inflexion points and, for example, may curve so as to have three inflexion points.

Further, in the plate spring member 1310, distal end part 1310d which part is near to the end part 1310c than the inflexion point 1310a which is the nearest inflexion point to the end part 1310c at a side attached to the carrying part 1200 among the two inflexion points 1310a, 1310b supports the carrying part 1200 so as to force up the carrying part 1200 in the direction of the arrow "g" which is the direction across the thickness of the plate spring member 1310. In other words, the distal end part 1310d supports the carrying part 1200 so as to apply a force in a direction toward the fixing member 1230 with respect to the carrying part 1200 and also apply an upward force in the gravitational direction with respect to the carrying part 1200.

Further, in the plate spring member 1310, a rear end part 1310f which part is nearer to the end part 1310e at a side attached to the adjustment mechanism 1550 than the inflexion point 1310a which is the nearest inflexion point to the end part 1310c at a side attached to the carrying part 1200 among the two inflexion points 1310a, 1310b is used as a normal spring, i.e. a member which generates a reaction force in response to a deformation thereof.

In the antivibration device 1010 having the above constitution, the movable member 1510 can move in the direction of arrow "e" when the adjustment mechanism 1550 is manipulated by an operating personnel, and the position where the plate spring member 1310 is attached to the support part 1100 can be changed by moving the movable member 1510.

Further, in the adjustment mechanism 1550 configured with the above constitution, when the screw member 1530 is manipulated by an operating personnel, the angle θ in which the plate spring member 1310 is attached to the support part 1100 can be changed. Moving the screw member 1530 in the direction of f1 (refer FIG. 19) with respect to the attachment plate 1504 by manipulating the screw member 1530, the attachment plate 1504 and the plate spring member 1310 can be rotated into the direction of arrow d1 (refer FIG. 19), and can decrease the angle θ. On the other hand, moving the screw member 1530 in the direction of c2 (refer FIG. 19) with respect to the attachment plate 1504, the attachment plate 1504 and the plate spring member 1310 can be rotated into the direction of the arrow d2 (refer 19), and can increase the angle θ.

In the antivibration device 1010, by changing at least one of the position where the plate spring member 1310 is attached to the support part 1100 and the angle θ in which the plate spring member 1310 is attached to the support part 1100, the positions where the inflexion points 1310a, 1310b are formed on the plate spring member 1310 can be changed. The length of the distal end part 1310d and the length of the rear end part 1310f of the plate spring member 1310 can be changed by changing the position of the inflexion point 1310a of the plate spring member 1310. And the force of the plate spring member 1310 lifting the carrying part 1200 in the direction of the arrow g can be adjusted by changing the length of the distal end part 1310d and the length of the rear end part 1310f of the plate spring member 1310.

As described above, in the antivibration device 1010, by changing at least one of the position where die plate spring member 1310 is attached to the support part 1100 and the angle θ in which the plate spring member 1310 is attached to the support part 1100, the force of the plate spring member 1310 lifting the carrying part 1200 in the direction of the arrow g can be adjusted, and therefore, the same plate spring member 1310 can be employed in the target object 1900 for antivibration which weight is in a predetermined range without replacing with other plate spring member which has a different strength.

Further, in the antivibration device 1010, by changing at least one of the position where the plate spring member 1310 is attached to the support part 1100 and the angle θ in which the plate spring member 1310 is attached to the support part 1100, the vibration transfer rate when the vibration is transferred to the target object 1900 for antivibration can be changed.

Figure 21A:
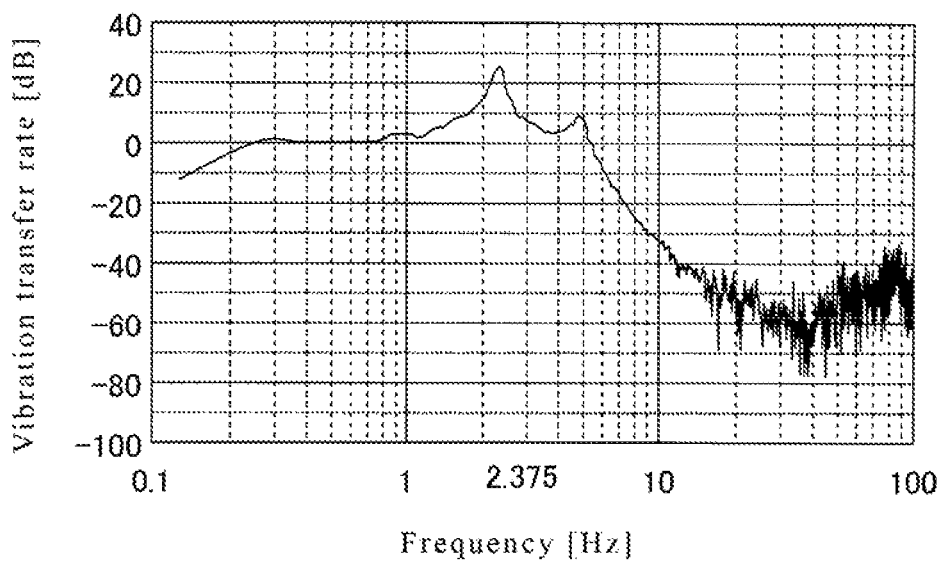
FIG. 21A shows a graphic chart showing a measurement result of the vibration transfer rate in the case that the attachment angle θ of the elastic bodies against the support part is θ1.
Figure 21B:
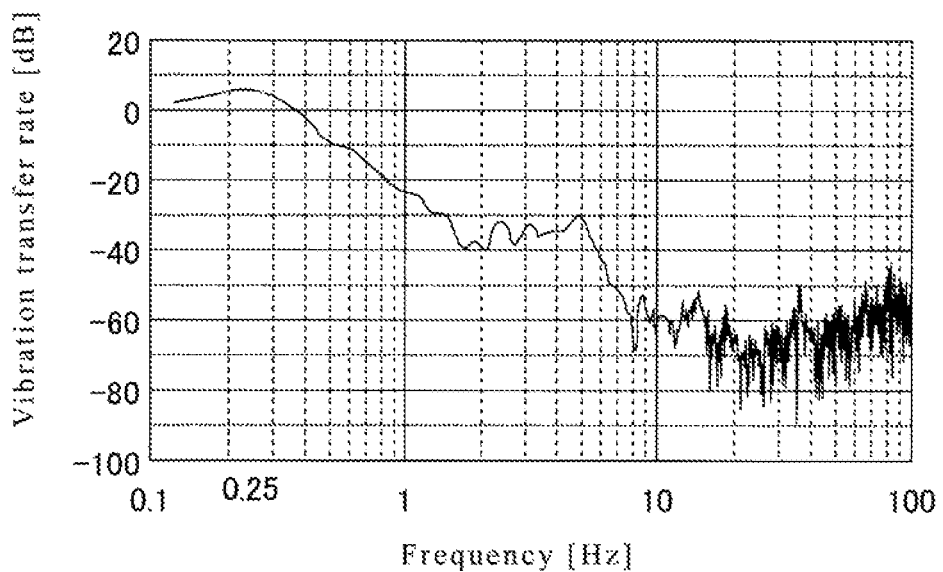
FIG. 21B shows a graphic chart showing a measurement result of the vibration transfer rate in the case that the angle θ is determined to an angle θ2 which is different angle from the angle θ1.

FIG. 21 shows effects of the antivibration device 1010. FIG. 21A shows a graphic chart showing a measurement result of the vibration transfer rate in the case that the attachment angle θ of the plate spring member 1310 against the support part 1100 is θ1. FIG. 21B shows a graphic chart showing a measurement result of the vibration transfer rate in the case that the angle θ is determined to an angle θ2 which is different angle from the angle θ1. In FIGS. 21A and 21B, the horizontal axis shows a vibration frequency of the installation surface 1920 in the vertical direction while the vertical axis shows a ratio of a vibration of the target object 1900 for antivibration in the vertical direction to a vibration of the installation surface 1920 in the vertical direction. More specifically, the vertical axis shows:

Vibration Transfer Rate (dB)=20×Log 10 (vibration of the target object 1900 for antivibration/vibration of the installation surface 1920)

In comparison FIG. 21A with FIG. 21B, it is found that in the antivibration device 1010, the vibration transfer rate to the target object 1900 for antivibration can be changed by changing the angle θ of the plate spring member 1310 being attached to the support part 1100.

As a result of the measurement, the natural frequency f0 which is the frequency of the installation surface 1920 when the vibration transfer rate is the maximum value is: 2.375 [Hz] when the angle θ is the angle θ1; and 0.25 [Hz] when the angle θ is the angle θ2. Here, the value of the natural frequency f0 means that the smaller the value thereof is, the more the transfer of the vibration in low frequency is restrained and that the smaller the value thereof is, the larger the restraining effect against vibration is.

Figure 22:
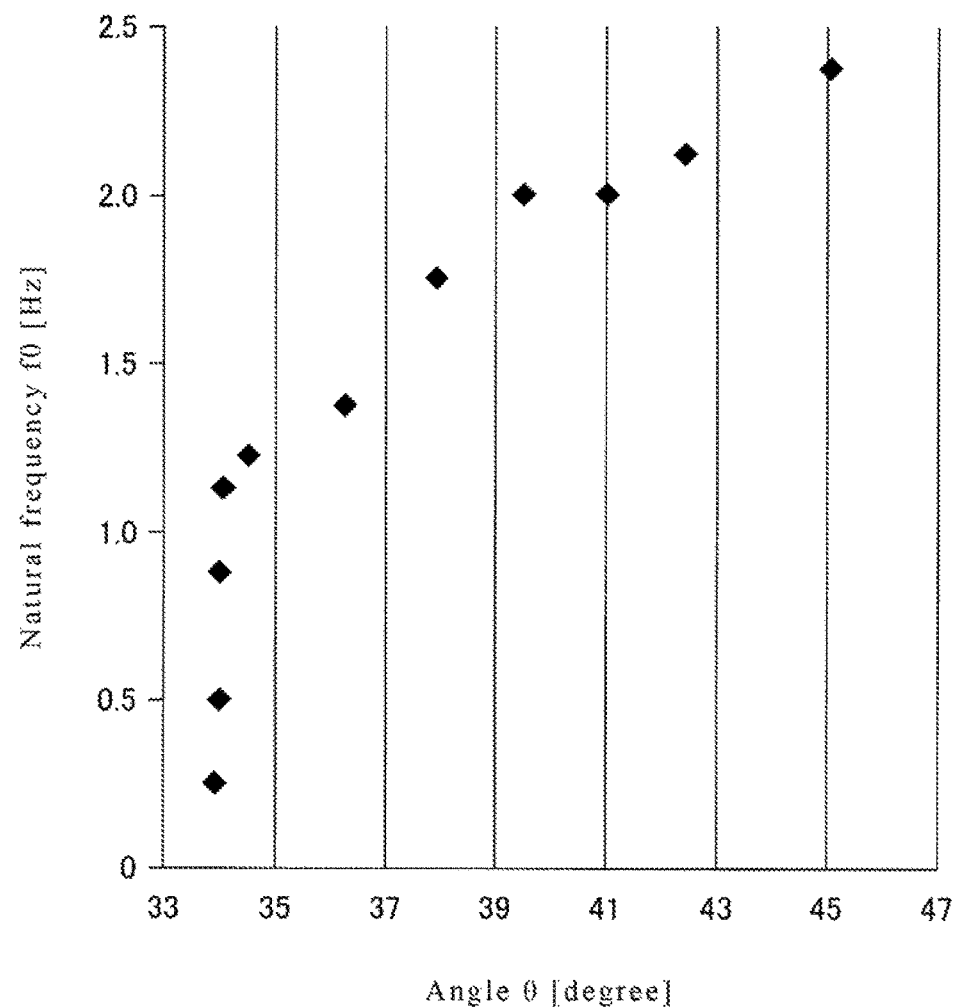
FIG. 22 shows a graphic chart showing a measurement result for measuring the natural frequency at the time when the vibration being transferred to the target object for antivibration at each allele of the elastic bodies attached against the support part when the angle is varied.

FIG. 22 shows a measurement result for measuring the natural frequency f0 at each angle θ of the plate spring member 1310 attached against the support part 1100 when the angle θ is varied.

Figure 23A:
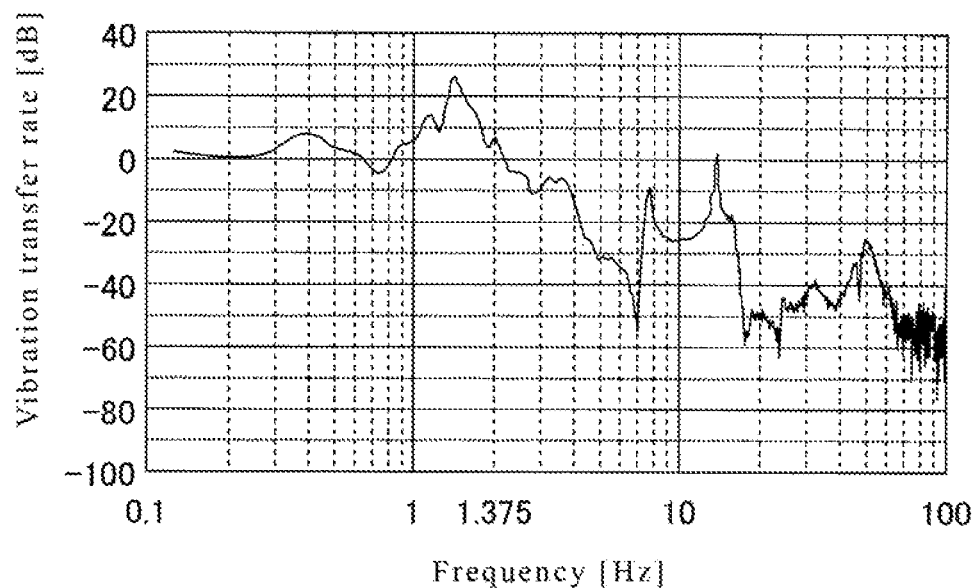
FIG. 23A shows a graphic chart showing a measurement result of the vibration transfer rate in the case that the elastic bodies are moved from a reference position by a distance d1.
Figure 23B:
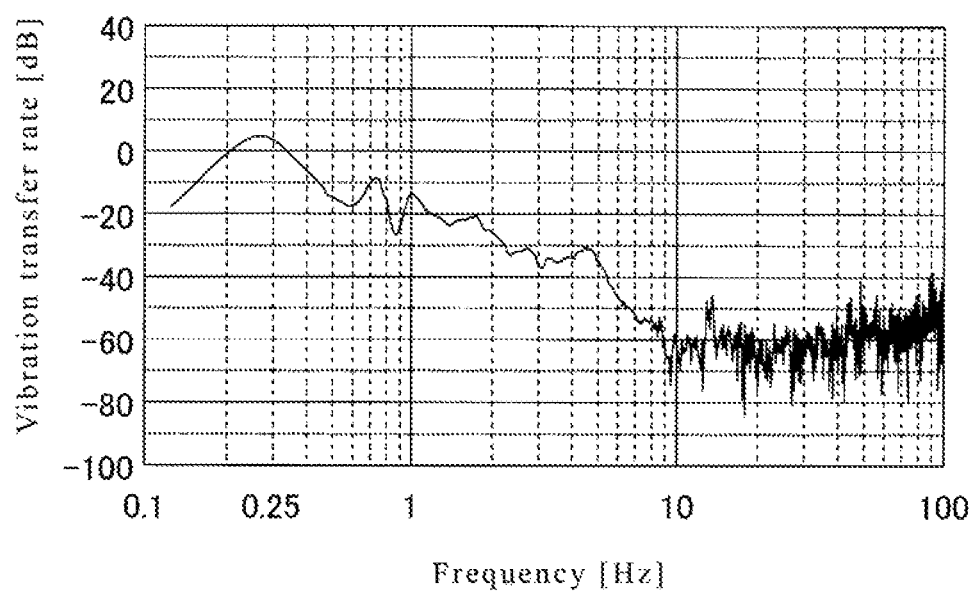
FIG. 23B shows a graphic chart showing a measurement result of the vibration transfer rate in the case that the elastic bodies are moved from the reference position by a distance d2 which is different from the distance d1.

FIG. 23 shows an effect of the antivibration device 1010. FIG. 23A shows a graphic chart showing a measurement result of the vibration transfer rate in the case that the plate spring member 1310 is moved from a reference position by a distance d1. FIG. 23B shows a graphic chart showing a measurement result of the vibration transfer rate in the case that the plate spring member 1310 is moved from a reference position by a distance d2. In FIGS. 23A and 23B, the horizontal axis shows a vibration frequency of the installation surface 1920 in the vertical direction while the vertical axis shows a ratio of a vibration of the target object 1900 for antivibration in the vertical direction to a vibration of the installation surface 1920 in the vertical direction. More specifically, the vertical axis shows:

Vibration Transfer Rate (dB)=20×Log 10 (vibration of the target object 1900 for a antivibration/ vibration of the installation surface 1920)

In comparison FIG. 23A with FIG. 23B, it is found that in the antivibration device 1010, the vibration transfer rate to the target object 1900 for antivibration can be changed by changing the position of the plate spring member 1310 being attached to the support part 1100.

As a result of the measurement, the natural frequency f0 is: 1.375 [Hz] when the plate spring member 1310 is moved from the reference position by the distance d1; and 0.25 [Hz] when the plate spring member 1310 is moved from the reference position by the distance d2.

Figure 24:
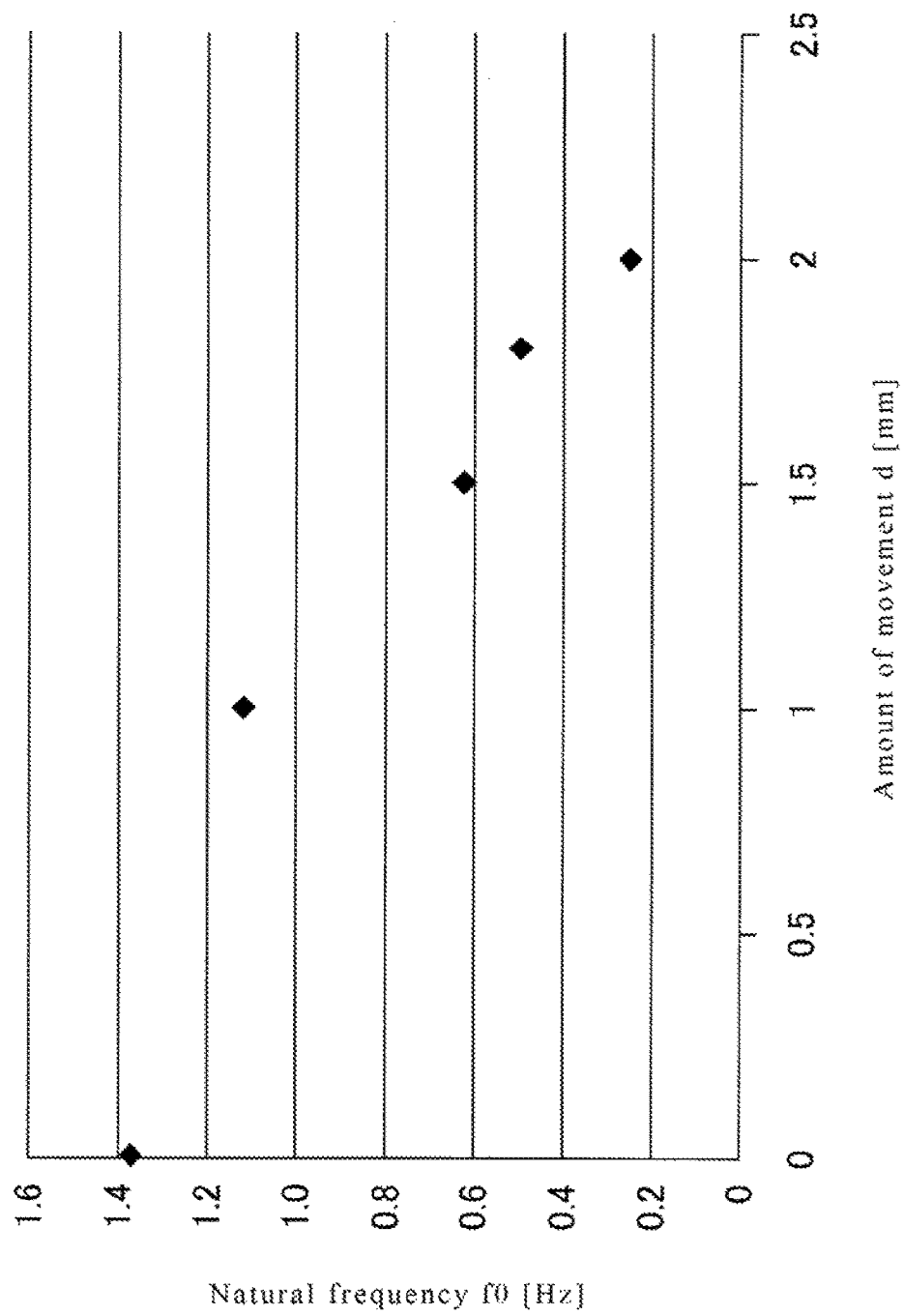
FIG. 24 shows a graphic chart showing a measurement result for measuring the natural frequency at the time when the vibration being transferred to the target object for antivibration each position of the elastic bodies attached to the support part when the attached position is varied.

FIG. 24 shows a measurement result for measuring the natural frequency f0 at each distance d of the plate spring member 1310 from the reference position when the distance d is varied.

Figure 25:
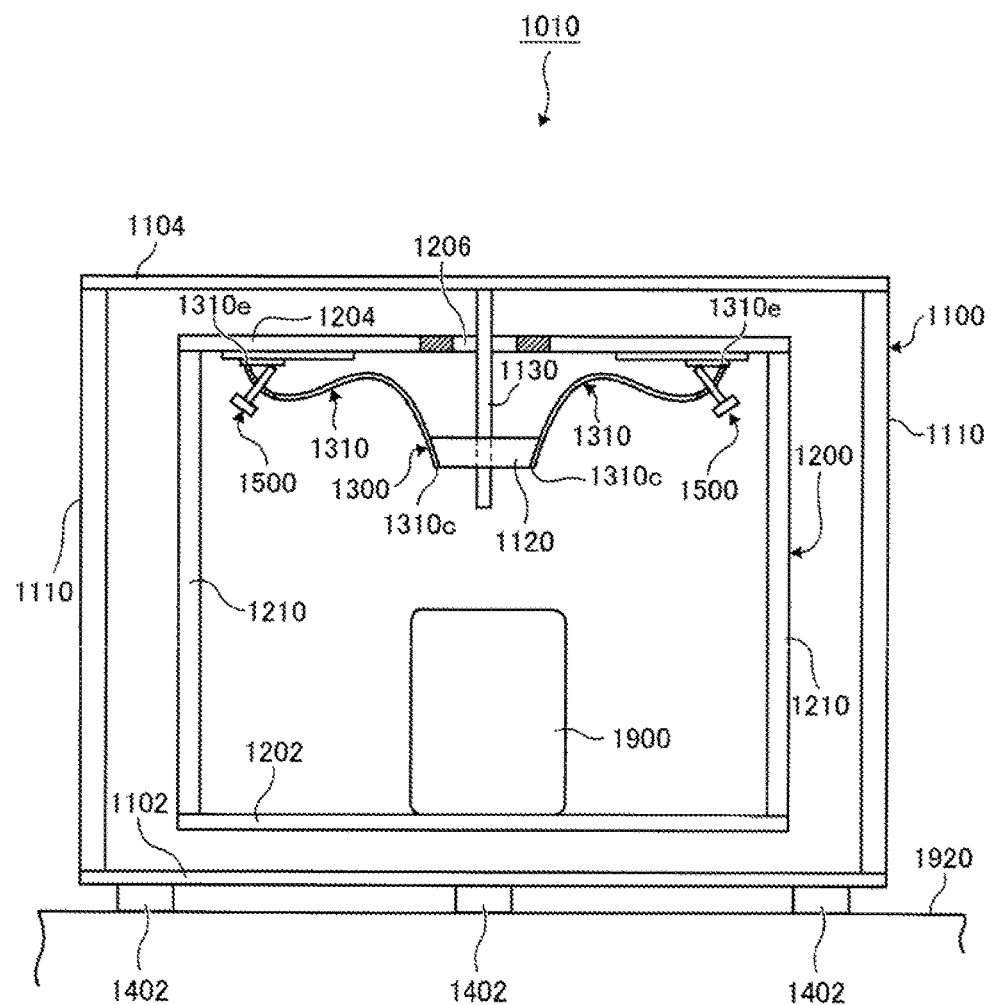
FIG. 25 shows a side elevational view depicting an antivibration device according to the ninth embodiment of the present invention.

The antivibration device 1010 according to the ninth embodiment of the present invention will be described hereinafter. FIG. 25 shows an antivibration device according to the ninth embodiment of the present invention. The anti-vibration device 1010 according to the ninth embodiment of the present invention has a support part 1100, a carrying part 1200, a connecting mechanism 1300, foot members 1402, and adjustment mechanisms 1500 as the same manner with the antivibration device 1010 according to the aforementioned eighth embodiment.

In the antivibration device 1010 according to the ninth embodiment, although the support part 1100 has the bottom plate 1102, the top plate 1104, and (e.g. four) post members 1110 as the same manner with the antivibration device 1010 according to the aforementioned eighth embodiment, however, the through hole 1106 (refer to FIG. 18) which is formed in the antivibration device 1010 according to the eighth embodiment is not formed in the top plate 1104. In contrast, the antivibration device 1010 according to the ninth embodiment has an attachment member 1220 to which one end part side of the plate spring member 1310 is attached, and a fixing member 1130 for fixing the attachment member 1120 to the top plate 1104.

The attachment member 1120 is a plate-shaped member for example, and is placed under the top plate 1104 in the gravitational direction. The fixing member 1130 is a rod type member for example and is placed so as to penetrate through a through hole 1206 described later; and the top end side thereof is fixed to the lower surface of the top plate 1104 while the bottom end side thereof is fixed to the attachment member 1120.

Since the foot members 1402 are the same with the ones in the antivibration device 1010 according to the aforementioned eighth embodiment, thus the explanation will be omitted.

Although the carrying part 1200 has the bottom plate 1202, the top plate 1204, and (e.g. four) post members 1210 as the same manner with the antivibration device 1010 according to the aforementioned eighth embodiment, however, the caning part 1200 does not have the attachment member 1220 or the fixing member 1230 (refer FIG. 18) which are included in the antivibration device 1010 according to the aforementioned eighth embodiment. In contrast, the top plate 1204 is formed with a through hole 1206 in the antivibration device 1010 according to the ninth embodiment.

The connecting mechanism 1300 has two plate spring members 1310 for example as the same manner with the antivibration device 1010 according to the aforementioned eighth embodiment. In each of the two plate spring members 1310, the end 1310c side thereof is attached to the attachment member 1120 of the support part 1100 while the end 1310e side thereof is attached to the top plate 1204 of the carrying part 1200 via an adjustment mechanism 1500, respectively. In the ninth embodiment, the connecting mechanism 1300 may also have at least two plate spring members 1310. The connecting mechanism 1300 may also have three or more plate spring members 1310.

The adjustment mechanisms 1550, in the ninth embodiment, are used as position adjustment mechanisms for changing the positions where the plate spring members 1310 are attached to the downwardly directed surface of the top plate 1204 of the carrying part 1200 and are used as angle adjustment mechanisms for changing the angle θ (refer to FIG. 26) for attaching the plate spring members 1310 to the downwardly directed surface of the top plate 1204 of the carrying part 1200.

The parts constitution of the adjustment mechanism 1500 is the same with the adjustment mechanism 1500 of the antivibration device 1010 according the aforementioned embodiment 8. That is, the adjustment mechanism 1500 has an attachment plate 1504, a hinge 1512, a movable member 1510, a rail member 1520, and a screw member 1530 (refer FIG. 19) as the same manner with the antivibration device 1010 according to the aforementioned eighth embodiment. Although the rail member 1520 is fixed on the upwardly directed surface of the top plate 1104 in the antivibration device 1010 according to the aforementioned eighth embodiment, however, the rail member 1520 is fixed on the lower surface of the top plate 1204 in the antivibration device 1010 according to the ninth embodiment.

Figure 26:
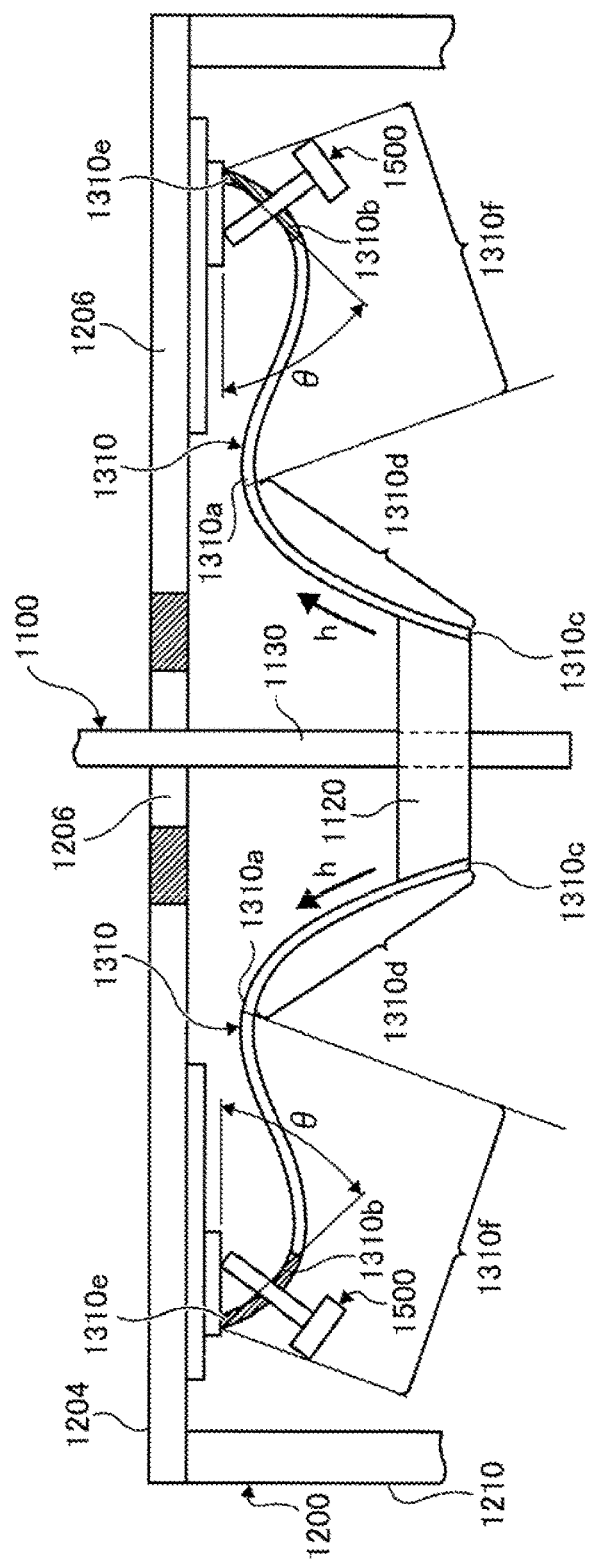
FIG. 26 shows an enlarged view of elastic bodies included by the antivibration device depicted by FIG. 25.

FIG. 26 shows the plate spring members 1310 in an enlarged manner. The each plate spring member 1310 curves so as to have two inflexion points 1310a, 1310b as the same with the antivibration device 1010 according to the aforementioned eighth embodiment. Further, in the plate spring member 1310, distal end part 1310d which part is near to the end part 1310c than the inflexion point 1310a which is the nearest inflexion point to the end part 1310c at a side attached to the support part 1100 among the two inflexion points 1310a, 1310b supports the carrying part 1200 so as to force up the carrying part 1200 in the direction of the arrow "h" which is the direction across the thickness of the plate spring member 1310. In other words, the distal end part 1310d supports the carrying part 1200 so as to apply a force in a direction toward the fixing member 1130 with respect to the carrying part 1200 and also apply an upward force in the gravitational direction with respect to the carrying part 1200.

Further, in the plate spring member 1310, a rear end part 1310f which part is nearer to the end part 1310e at a side attached to the adjustment mechanism 1550 than the inflexion point 1310a which is the nearest inflexion point to the end part 1310c at a side attached to the support part 1100 among dm two inflexion points 1310a, 1310b is used as a normal spring, i.e. a member which generates a reaction force in response to a deformation thereof.

In the antivibration device 1010 having the above constitution according to the ninth embodiment, the position where the plate spring member 1310 is attached to the carrying part 1200 can be changed and the angle θ in which the plate spring member 1310 is attached to the support part 1100 can be changed when the adjustment mechanism 1550 is manipulated by an operating personnel. And in the antivibration device 1010 according to the ninth embodiment, by changing at least one of the position where the plate spring member 1310 is attached to the carrying part 1200 and the angle θ in which the plate spring member 1310 is attached to the carrying part 1200, the positions where the inflexion points 1310a, 1310b are formed on the plate spring member 1310 can be changed.

And the length of the distal end part 1310d and the length of the rear end part 1310f of the plate spring member 1310 can be changed by changing the position of the inflexion point 1310a of the plate spring member 1310 while the three of the plate spring member 1310 lifting the carrying part 1200 in the direction of the arrow h can be adjusted by changing the length of the distal end part 1310d and the length of the rear end part 1310f of the plate spring member 1310.

Figure 27:
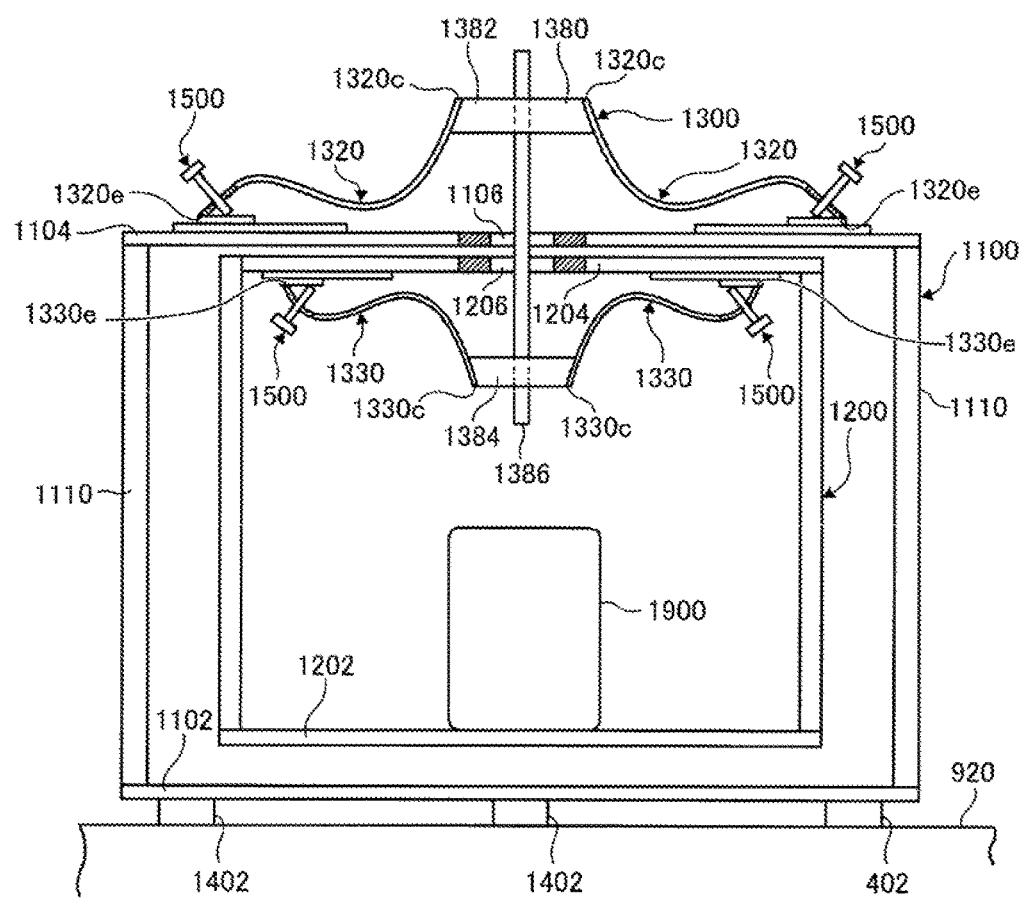
FIG. 27 shows a side elevational view depicting an antivibration device according to the tenth embodiment of the present invention.

The antivibration device 1010 according to the tenth embodiment of the present invention will be described hereinafter. FIG. 27 shows an antivibration device 1010 according to the tenth embodiment of the present invention. The antivibration device 1010 according to the tenth embodiment of the present invention has a support part 1100, a carrying part 1200, a connecting mechanism 1300, foot members 1402, and adjustment mechanisms 1500 as the same manner with the antivibration device 1010 according to the aforementioned eighth embodiment.

Since the support part 1100 is the same with the one in the antivibration device 1010 according to the aforementioned eighth embodiment, thus the explanation regarding the support part 1100 will be omitted.

Since the foot members 1402 are the same with the ones in the antivibration device 1010 according to the aforementioned eighth embodiment, thus the explanation regarding the foot members 1402 will be omitted.

Although the carrying part 1200 has the bottom plate 1202, the top plate 1204, and (e.g. four) post members 1210 as the same manner with the antivibration device 1010 according to the aforementioned eighth embodiment, however, the carrying part 1200 does not have the attachment member 1220 or the fixing member 1230 (refer FIG. 18) which are included in the antivibration device 1010 according to the aforementioned eighth embodiment. In contrast, the top plate 1204 is formed with a through hole 1206 in the antivibration device 1010 according to the tenth embodiment.

The connecting mechanism 1300 has a suspending part 1380 which suspends the carrying part 1200, e.g. two first plate spring members 1320 used as a first elastic body, and e.g. two second plate spring member 1330 used as a second elastic body.

The suspending part 1380 has a first attachment member 1382 to which the first plate spring members 1320 are attached, a second attachment member 1384 to which the second plate spring members 1330, and a connecting member 1386 connecting the first attachment member 1382 with the second attachment member 1384. The first attachment member 1382 is a plate-shaped member fix example, and is placed above the top plate 1104 and above the through hole 1106. The second attachment member 1384 is a plate-shaped member for example, and is placed under the top plate 1204 and under the through hole 1206. The connecting member 1386 is a rod type member for example and is placed so that one end side thereof is fixed to the first attachment member 1382 while the other end side thereof is attached to the second attachment member 1384.

The first plate spring member 1320 has almost the same constitution with the plate spring member 1310 of the antivibration device 1010 according to the aforementioned eighth embodiment. That is, the plate spring members 1310 of the antivibration device 1010 according to the aforementioned eighth embodiment are attached to the attachment member 1220 at the end parts 1310c thereof (refer FIG. 20) in one hand, it is different in that the first plate spring members 1320 are attached to the first attachment member 1382 at the end parts 1320c thereof in other hand, however, the first plate spring members 1320, with regard to the other part, are the same with the plate spring members 1310 of the antivibration device 1010 according to the aforementioned eighth embodiment.

More specifically, the first plate spring members 1320 are attached to the support part 1100 at the other end sides 1320e thereof via the adjustment mechanisms 1500 as the same manner with the plate spring members 1310 of the antivibration device 1010 according to the eighth embodiment. That is, the each first plate spring member 1320 curves so as to have at least two (e.g. two) inflexion points. The position where the first plate spring members 1320 are attached to the support part 1100 can be changed by manipulating the adjustment mechanisms 1500 while the angle in which the first plate spring members 1320 are attached to the support part 1100 can be changed by manipulating the adjustment mechanisms 1500.

The second plate spring member 1330 has almost the same constitution with the plate spring member 1310 of the antivibration device 1010 according to the aforementioned ninth embodiment. That is, the plate spring members 1310 of the antivibration device 1010 according to the aforementioned ninth embodiment are attached to the attachment member 1220 at the end parts 1310c thereof (refer FIG. 26) in one hand, it is different in that the second plate spring members 1330 are attached to the attachment member 1384 at the end parts 1330c thereof in other hand, however, the second plate spring members 1330, with regard to the other part, are the same with the plate spring members 1310 of the antivibration device 1010 according to the aforementioned ninth embodiment.

More specifically, the second plate spring members 1330 are attached to the top plate 1204 of the carrying part 1200 at the other end sides 1320e thereof via the adjustment mechanisms 1500 as the same manner with the plate spring members 1310 of the antivibration device 1010 according to the eighth embodiment. That is, the each second plate spring member 1330 curves so as to have at least two (e.g. two) inflexion points. The position where the second plate spring members 1330 are attached to the carrying part 1200 can be changed by manipulating the adjustment mechanisms 1500 while the angle in which the second plate spring members 1330 are attached to the carrying part 1200 can be changed by manipulating the adjustment mechanisms 1500.

Figure 28:
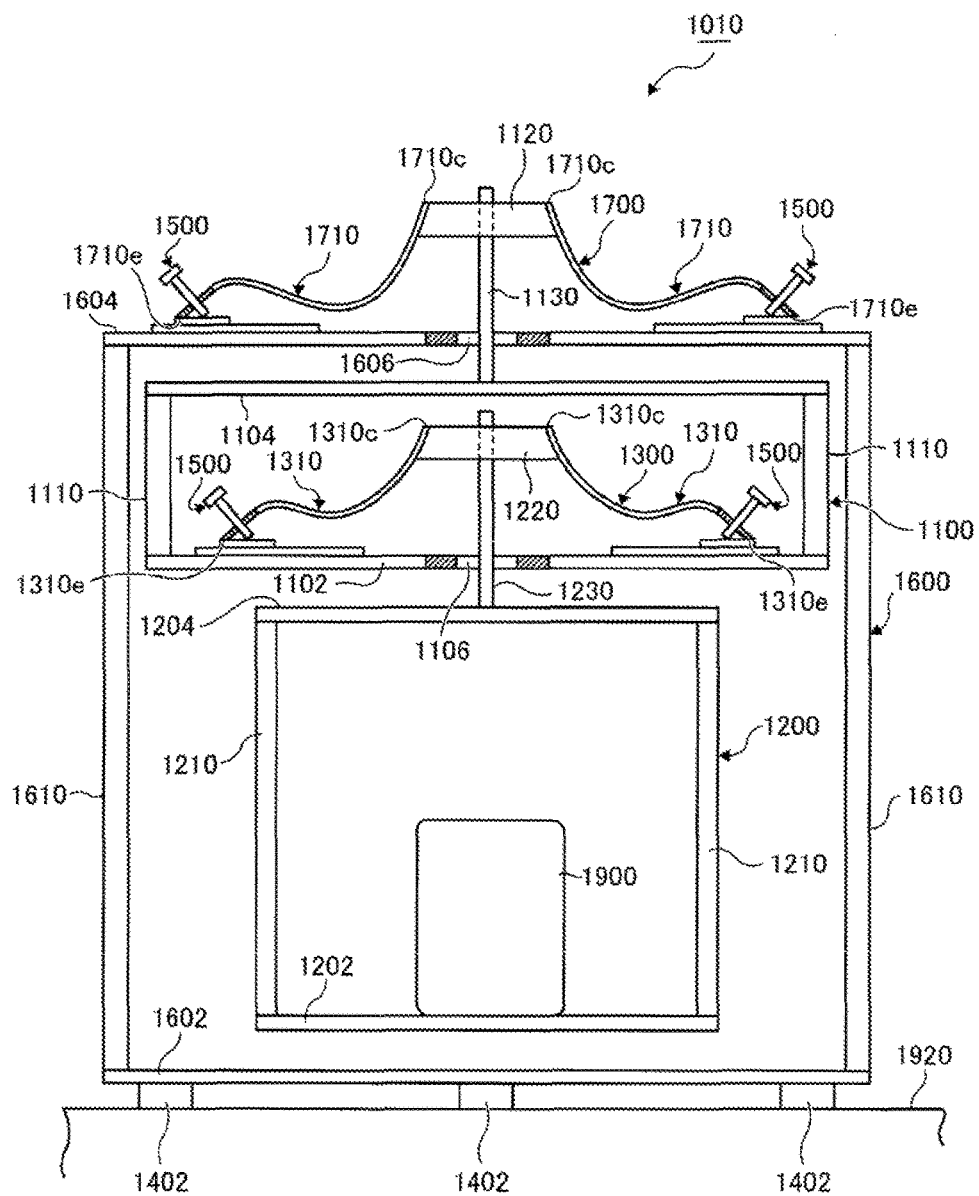
FIG. 28 shows a side elevational view depicting an antivibration device according to the eleventh embodiment of the present invention.

The antivibration device 1010 according the eleventh embodiment of the present invention will be described hereinafter. FIG. 28 shows an antivibration device 1010 according to the eleventh embodiment of the present invention. In the antivibration device 1010 according to the aforementioned embodiment, the support part 1100 supporting the carrying part 1200 is mounted on the installation surface 1920 via the foot members 1402 (refer FIG. 18). In contrast, in this eleventh embodiment, a first support part 1100 supporting the carrying part 1200 is further supported by a second support part 1600, and the second support part 1600 is mounted on an installation surface 1920 via foot members 1402.

Further, in the antivibration device 1010 according to the aforementioned eight embodiment, the carrying part 1200 and the support part 1100 are connected by the connecting mechanism 1300 (refer FIG. 18). In contrast, in this eleventh embodiment, the carrying part 1200 and the first support part 1100 are connected by a first connecting mechanism 1300 and the first support part 1100 and the second support part 1600 are connected by a second support part 1600.

The carrying part 1200 is the same with the carrying part 1200 according to the aforementioned eighth embodiment. Therefore, the explanation regarding the carrying part 1200 will be omitted.

The first support part 1100 is used as the first support part for supporting the carrying part 1200 and has a bottom plate 1102 and a top plate 1104; and the bottom plate 1102 and the top plate 1104 are connected by, for example, the four post members 1110 (only two thereof are shown in FIG. 28) thereby forming the frame body. Further, the bottom plate 1102 is formed with a through hole 1106, for example, at the center part thereof.

Further, the first support part 1100 has an attachment member 1120 to which an end part 1710*c* of a second plate spring member 1710 described later is attached, and a fixing member 1130 for fixing an attachment member 1120 to the top plate 1104. The attachment member 1120 is a plate-shaped member for example, and is placed above a top plate 1604 described later in the gravitational direction and above a through hole 1606 described later in the gravitational direction. The fixing member 1130 is a rod type member for example and is placed so as to penetrate through the through hole 1606; and the bottom end side thereof is fixed to the top plate 1104 while the top end side thereof is fixed to the attachment member 1120.

The second support part 1600 is a structure for supporting the first support part 1100, has a bottom plate 1602 and a top plate 1604; and the bottom plate 1602 and the top plate 1604 are connected by, for example, four post members 1610 (only two thereof are shown in FIG. 28) thereby forming a frame body. The top plate 1604 is formed with a through hole 1606, for example, at the center part thereof.

The foot members 1402 is the same with the foot members 1402 according to the aforementioned eighth embodiment. Therefore, the explanation regarding the foot members 1402 will be omitted.

The constitution of the first connecting mechanism 1300 is almost the same with the connecting mechanism 1300 according to the aforementioned eighth embodiment. That is, the first connecting mechanism 1300 has two first plate spring members 1310 for example used as at least two first elastic bodies; and each two first plate spring member 1310 is attached to the carrying part 1200 at the end part 1310*c* side thereof and is also attached to the first support part 1100 at the end part 1310*e* side thereof. More specifically, the end 1310*c* sides of the two first spring members 1310 are attached to the attachment member 1220 of the carrying part 1200 while the end 1310*e* sides thereof are attached to the upwardly directed surface of the bottom plate 1102 of the first support part 1100 via adjustment mechanisms 1500. Since the adjustment mechanism 1500 is the same with the adjustment mechanism 1500 in the eighth embodiment, thus the explanation will be omitted.

The first plate spring members 1310 curves so as to have at least two (e.g. two) inflexion points as the same with the plate spring member 1310 in the eighth embodiment.

The second connecting mechanism 1700 is a mechanism for connecting the first support part 1100 with the second support part 1600 and has two second plate spring members 1710 for example used as at least two elastic bodies. In the each two second plate spring member 1710, the end part 1710*c* side thereof is attached to the first support part 1100 while the end part 1710*e* side thereof is attached to the second support part 1600. More specifically, the end part 1710*c* sides of the two second plate spring member 1710 are attached to the attachment member 1120 of the first support part 1100 while the end part 1710*e* sides thereof are attached to the upwardly directed surface of the top plate 1604 of the second support part 1600 via adjustment mechanisms 1500. Since the adjustment mechanism 1500 is the same with the adjustment mechanism 1500 in the eighth embodiment, thus the explanation will be omitted.

The second plate spring members 1710 curves so as to have at least two (e.g. two) inflexion points as the same with the plate spring member 1310 in the eighth embodiment.

Figure 29:
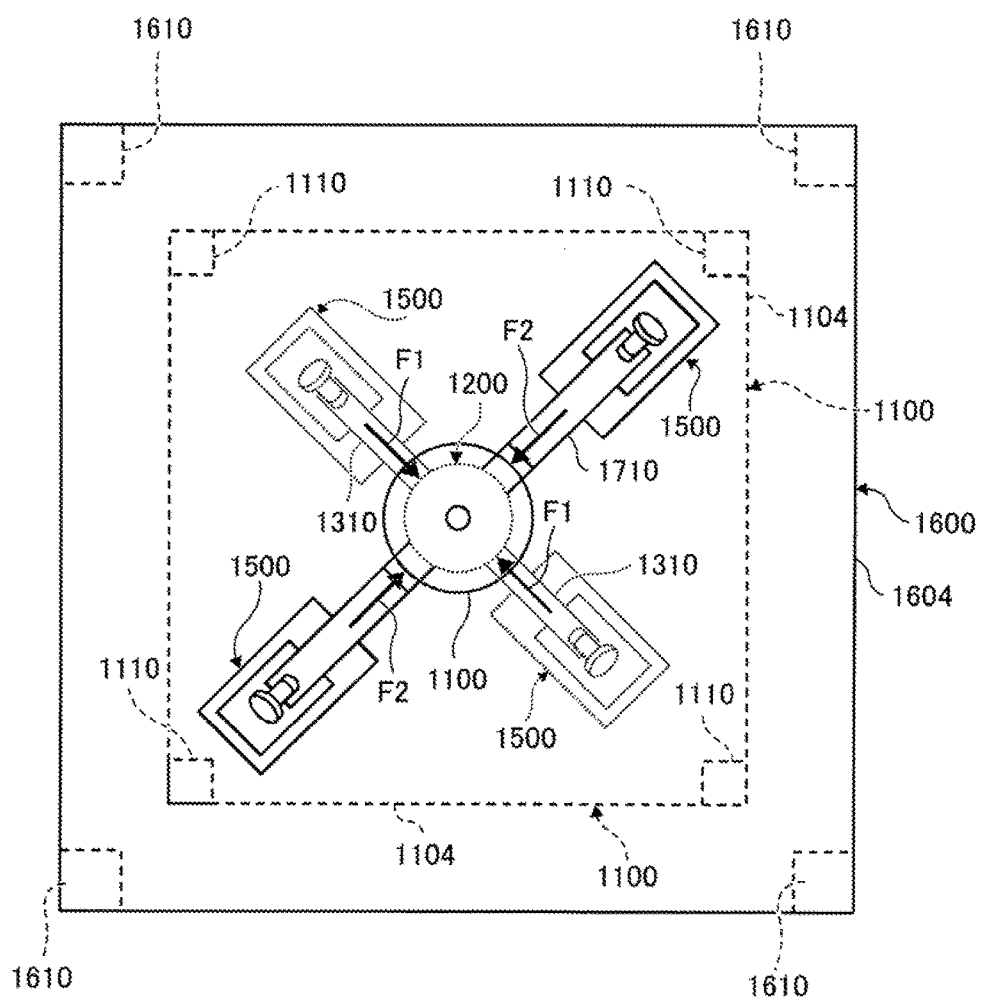
FIG. 29 shows a plan view depicting a modified example of an antivibration device according to eleventh embodiment of the present invention.

FIG. 29 shows a modified example of the anti vibration device 1010 according to the aforementioned eleventh embodiment. In the antivibration device 1010 according to the aforementioned eleventh embodiment, the force applied by the first plate spring members 1310 to the carrying part 1200 and the force applied by the second plate spring members 1710 to the first support part 1100 are directed to the same direction with respect to the horizontal direction. In this modified example, in contrast, the force F1 applied by the first plate spring members 1310 to the carrying part 1200 and the force F2 applied by the second plate spring members 1710 to the first support part 1100 are directed to different directions in the horizontal plane direction as shown in FIG. 29.

Figure 30A:
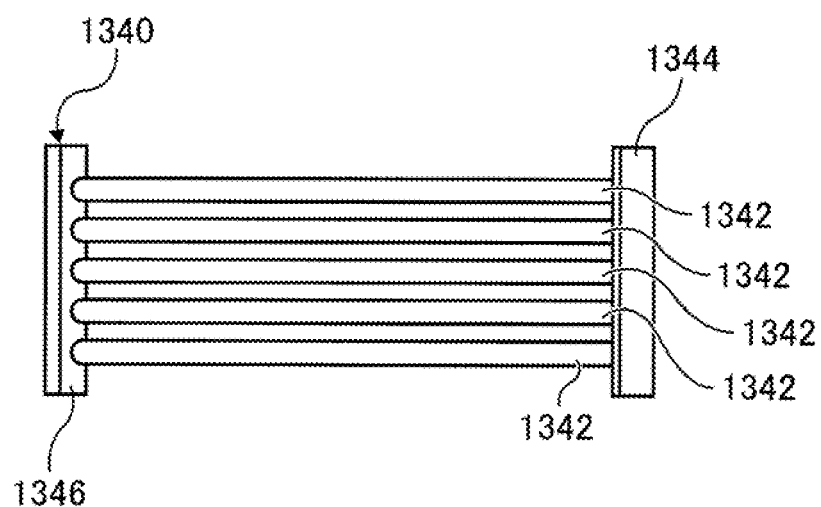
FIG. 30A shows the modified example of the elastic body viewing from the above.
Figure 30B:
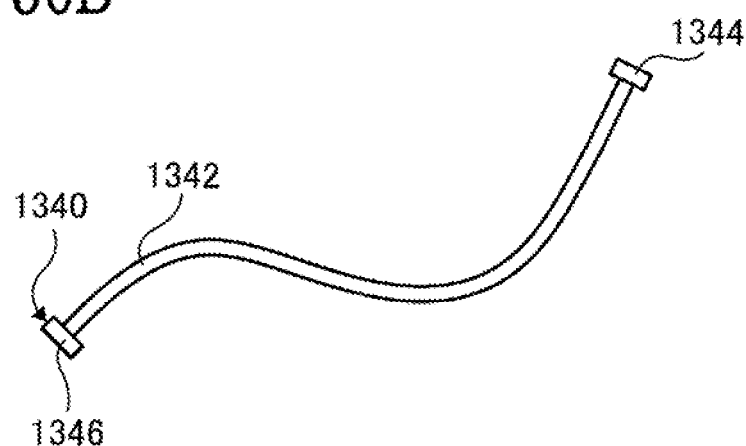
FIG. 30B shows the modified example of the elastic body viewing form a lateral direction.

FIG. 30 shows an elastic structure body 1340 which can be used as an elastic body alternative to the plate spring member 1310. The elastic structure body 1340 has a plurality of (e.g. five) rod-shaped elastic bodies 1342. These rod-shaped elastic bodies 1342 are supported each other by one ends thereof being fixed to a support member 1344 and another ends thereof being fixed to a support member 1346.

As the same with the elastic structure body 1340 being able to be used alternative to the plate spring member 1310, the elastic structure body 1340 can be used alternative to the first plate spring member 1320 (refer FIG. 27) and the elastic structure body 1340 also can be used alternative to the second plate spring member 1330 (refer FIG. 27). Further, the elastic structure body 1340 can be used alternative to the first plate spring member 1310 (refer FIG. 28) and the elastic structure body 1340 can be used alternative to the second plate spring member 1710 (refer FIG. 28).

Figure 31:
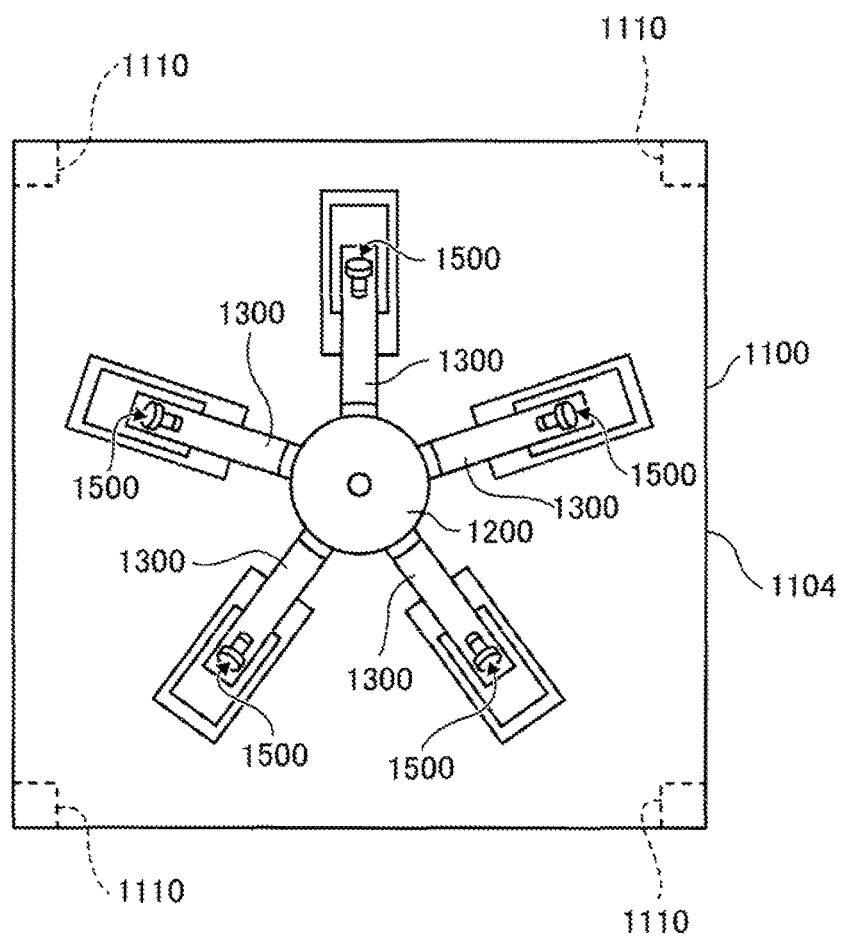
FIG. 31 shows a plan view depicting a modified example of an antivibration device according to eighth embodiment of the present invention.

FIG. 31 shows a modified example of the antivibration device 1010 according to the aforementioned eighth embodiment. The antivibration device 1010 according to the aforementioned eighth embodiment has two plate spring members 1310 which is used for the elastic bodies. In contrast, in this modified embodiment, there are five plate spring members 1310. The five plate spring members 1310 are placed so that the forces applied to the carrying part 1200 are balanced with each other in the horizontal plane direction. For example, in the case that the five plate spring member 1310 have the same biasing, force, these five plate spring members 1310 are placed so that every two neighboring plate spring members 1310 have the same angle therebetween.

As the same with the antivibration device 1010 being provided with five plate spring members 1310 as the modified example of the antivibration device 1010 according to the eighth embodiment, the antivibration device 1010 can be provided with live plate spring members 1310 as a modified example of the antivibration device 1010 according to the ninth embodiment. Further, as a modified example for the anti vibration device 1010 according to the tenth embodiment, the antivibration device 1010 can be provided with five first plate spring members 1320 and also the antivibration device 1010 can be provided with five second plate spring, members 1330. Further, as a modified embodiment for the antivibration device 1010 according to the eleventh embodiment, the antivibration device 1010 can be provided with five first plate spring members 1310 and also can be provided with five second plate spring members 1710.

INDUSTRIAL APPLICABILITY

The present invention can be applied to the antivibration device as described above.

EXPLANATION OF REFERENCE NUMERALS

10 antivibration device
100 support part
200 carrying part
300 connecting mechanism
30 suspending plate
304 suspending frame member
350 first viscoelastic body
352 suspending member
354 foot member
356 plate spring member
400 second viscoelastic body
402 foot member
900 target object for antivibration
1010 antivibration device
1100 support part, first support part
1200 carrying part
1300 connecting mechanism, first connecting mechanism
1310 plate spring member, first plate spring members
1310a, 1310b inflexion point
1320 first plate spring members
1330 second plate spring members
1380 suspending part
1500 adjustment mechanism
1600 second support part
1700 second connecting mechanism
1710 second plate spring members
1900 target object for antivibration

What is claimed is:

1. An antivibration device comprising:
a carrying part to which a target object for antivibration is mounted;
a support frame supporting the carrying part;
a connecting mechanism connecting the carrying part with the support frame; and wherein
the support frame is supported by at least one viscoelastic foot member that permits circumferential direction movement with respect to an installation surface;
the connecting mechanism has at least two elastic bodies which are attached to the carrying part at one end part side thereof and are attached to the support frame at the other end part side thereof; and
the each of the at least two elastic body curves so as to have at least two inflexion points.

2. The antivibration device according to claim 1 further has a position adjustment mechanism for adjusting the positions where the at least two elastic bodies are attached to the support frame.

3. The antivibration device according to claim 1 further has an angle adjustment mechanism for adjusting the angle of the at least two elastic bodies being attached to the support frame.

4. The antivibration device according to claim 1, wherein the at least two elastic bodies support the carrying part so that a portion from the inflexion point which is nearest to the one end part among the at least two inflexion points up to the one end part thereof forces up the carrying part in a direction across the thickness of the elastic bodies.

5. The antivibration device according to claim 1 further has a position adjustment mechanism for adjusting the positions where the at least two elastic bodies are attached to the carrying part.

6. The antivibration device according to claim 1 further has an angle adjustment mechanism for adjusting the angle of the at least two elastic bodies being attached to the carrying part.

7. The antivibration device according to claim 1, wherein the at least two elastic bodies support the carrying part so that a portion from the inflexion point which is nearest to the other end part among the at least two inflexion points up to the other end part thereof forces up the carrying part in a direction across the thickness of the elastic bodies.

8. The antivibration device according to claim 1, wherein the at least two elastic bodies are placed so that forces applied by the elastic bodies to the carrying part are balanced with each other in the horizontal plane direction.

9. An antivibration device comprising:
a carrying part to which a target object for antivibration is mounted;
a support part supporting the carrying part; and
a connecting mechanism connecting the carrying part with the support part; wherein
the connecting mechanism has:
a suspending rod having a first end and a second end and which suspending rod suspends the carrying part;
at least two first elastic bodies which are attached to the first end of the suspending rod at one end part side thereof and are attached to the support part at the other end part side thereof;
at least two second elastic bodies which are attached to the second end of the suspending rod at one end part side thereof and are attached to the carrying part at the other end part side thereof; wherein
the at least two first elastic bodies and the at least two second elastic bodies each curves so as to have at least two inflexion points.

10. An antivibration device comprising:
a carrying part that has a bottom plate, a top plate, and a fixing rod fixed to the top plate at a lower end of the fixing rod and on which bottom plate a target object for antivibration is mounted;
a first support part that has a bottom plate, a top plate, and a fixing rod fixed to the top plate of the first support part at the lower end thereof and which first support part supports the carrying part;
a second support part supporting the first support part;
a first connecting mechanism connecting the carrying part with the first support part; and
a second connecting mechanism connecting the first support part with the second support part; wherein the first connecting mechanism has at least two first elastic bodies which are attached to an upper end of the fixing rod of the carrying part at one end part side thereof and are attached to the bottom plate of the first support part at the other end part side thereof;

the second connecting mechanism has at least two elastic bodies which are supported by an upper end of the fixing rod of the first support part at one end part side thereof and are supported by the top plate of the second support part at the other end part side thereof; and the at least two first elastic bodies and the at least two second elastic bodies each curves so as to have at least two inflexion points.

11. The antivibration device according to claim 10, wherein force applied by the at least two first elastic bodies to the carrying part and force applied by the at least two second elastic bodies to the first support part are directed to different directions in the horizontal plane direction.

* * * * *